United States Patent
Ikeda et al.

(10) Patent No.: US 10,367,121 B2
(45) Date of Patent: Jul. 30, 2019

(54) PACKAGE AND LIGHT-EMITTING DEVICE

(71) Applicant: NICHIA CORPORATION, Anan-shi, Tokushima (JP)

(72) Inventors: Tadaaki Ikeda, Anan (JP); Masaki Hayashi, Anan (JP); Koji Abe, Anan (JP); Kimihiro Miyamoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/833,644

(22) Filed: Dec. 6, 2017

(65) Prior Publication Data
US 2018/0097150 A1  Apr. 5, 2018

Related U.S. Application Data

(63) Continuation of application No. 15/278,724, filed on Sep. 28, 2016, now Pat. No. 9,865,779.

(30) Foreign Application Priority Data

Sep. 30, 2015 (JP) .................. 2015-192683
Jun. 6, 2016 (JP) .................. 2016-112963

(51) Int. Cl.
*H01L 33/46* (2010.01)
*H01L 33/48* (2010.01)
(Continued)

(52) U.S. Cl.
CPC .......... *H01L 33/465* (2013.01); *H01L 33/483* (2013.01); *H01L 33/486* (2013.01); *H01L 33/60* (2013.01); *H01L 33/62* (2013.01); *H01L 33/44* (2013.01); *H01L 2224/48227* (2013.01); *H01L 2224/48237* (2013.01); *H01L 2224/8592* (2013.01); *H01L 2224/97* (2013.01); *H01L 2933/0025* (2013.01);
(Continued)

(58) Field of Classification Search
CPC ..... H01L 33/465; H01L 33/486; H01L 33/60; H01L 33/62; H01L 33/483
USPC ............................................................ 438/27
See application file for complete search history.

(56) References Cited

U.S. PATENT DOCUMENTS

| | | |
|---|---|---|
| 2014/0087498 A1 | 3/2014 | Terayama et al. |
| 2015/0023026 A1 | 1/2015 | Sakamoto et al. |
| 2017/0098625 A1 | 4/2017 | Takeda et al. |

FOREIGN PATENT DOCUMENTS

| | | |
|---|---|---|
| JP | 2004-111937 A | 4/2004 |
| JP | 2004-128393 A | 4/2004 |

(Continued)

OTHER PUBLICATIONS

Japanese Office Action Notification of Reasons for Refusal Application No. 2016-112963 dated Aug. 22, 2017. per MPEP 609. submitted in parent U.S. Appl. No. 15/278,724.

*Primary Examiner* — Anthony Ho
(74) *Attorney, Agent, or Firm* — Squire Patton Boggs (US) LLP

(57) ABSTRACT

A method of manufacturing a package, the method comprising the steps of: preparing a resin compact having a recess, and including a pair of leads arranged at a bottom surface of the recess, a first resin body forming a lateral wall of the recess, and a second resin body arranged between the pair of leads; forming a reflective film entirely on at least the bottom surface of the recess and an inner surface of the lateral wall of the recess; and removing the reflective film formed on the pair of leads in the recess in the resin compact on which the reflective film has been formed.

19 Claims, 14 Drawing Sheets

(51) Int. Cl.
  *H01L 33/62* (2010.01)
  *H01L 33/60* (2010.01)
  *H01L 33/44* (2010.01)
(52) U.S. Cl.
  CPC ............ *H01L 2933/0033* (2013.01); *H01L 2933/0058* (2013.01); *H01L 2933/0066* (2013.01)

(56) References Cited

FOREIGN PATENT DOCUMENTS

| | | |
|---|---|---|
| JP | 2004-134699 A | 4/2004 |
| JP | 2004-319939 A | 11/2004 |
| JP | 2007-173408 A | 7/2007 |
| JP | 2008-060344 A | 3/2008 |
| JP | 2008-160032 A | 7/2008 |
| JP | 2009-164648 A | 7/2009 |
| JP | 2010-505254 A | 2/2010 |
| JP | 2011-213948 A | 10/2011 |
| JP | 2012-216785 A | 11/2012 |
| JP | 2013-514642 A | 4/2013 |
| JP | 2014-158011 A | 8/2014 |
| JP | 2015-23081 A | 2/2015 |
| JP | 2015-505736 A | 2/2015 |
| WO | 2011/021402 A1 | 2/2011 |
| WO | 2011073027 A1 | 6/2011 |
| WO | 2013074357 A1 | 5/2013 |
| WO | 2014/017108 A1 | 7/2014 |

PACKAGE AND LIGHT-EMITTING DEVICE

CROSS-REFERENCE TO RELATED APPLICATION

This application is a 37 C.F.R. § 1.53(b) continuation of co-pending U.S. patent application Ser. No. 15/278,724 filed on Sep. 28, 2016, which claims priority to Japanese Patent Application No. 2015-192683 filed on Sep. 30, 2015 and Japanese Patent Application No. 2016-112963 filed on Jun. 6, 2016. The entire contents of all of the above applications are hereby incorporated by reference.

BACKGROUND

Technical Field

The present disclosure relates to methods of manufacturing the package and the light-emitting device.

Description of Related Art

In the markets of a backlight, an illumination, an in-vehicle component, a display, and the like, there have been increasing demands for LEDs achieving downsizing, higher efficiency, higher outputting power, higher reliability, and the like, and light-emitting devices that achieve improvement of these performances have been provided. In particular, a backlight for a mobile device has been thinned, and accordingly, the light-emitting device has been significantly thinned. Various kinds of light-emitting devices have been provided to meet these demands of the market.

For example, a light-emitting device disclosed in JP2008-160032 or JP2014-158011 includes a reflective layer on a ceramic package or a resin package so as to achieve an increased light outputting efficiency. This reflective layer is formed using a mask in a method such as vapor deposition, sputtering, or coating.

SUMMARY OF INVENTION

Embodiments according to the present disclosure provide a package and a light-emitting device that each includes a highly accurately arranged reflective film, and methods of manufacturing the package and the light-emitting device.

A method of manufacturing a package according to an embodiment of the present disclosure includes the steps of: preparing a resin compact having a recess, and including a pair of leads arranged at a bottom surface of the recess, a first resin body forming a lateral wall of the recess, and a second resin body arranged between the pair of leads; forming a reflective film entirely on at least the bottom surface of the recess and an inner surface of the lateral wall of the recess; and removing the reflective film formed on the pair of leads in the recess in the resin compact on which the reflective film has been formed.

A method of manufacturing of a light-emitting device according to an embodiment of the present disclosure includes the steps of: preparing a resin compact having a recess, and including a pair of leads arranged at a bottom surface of the recess, a first resin body forming a lateral wall of the recess, and a second resin body arranged between the pair of leads; forming a reflective film entirely on at least the bottom surface of the recess and an inner surface of the lateral wall of the recess; removing the reflective film formed on the pair of leads in the recess in the resin compact in which the reflective film has been formed; and disposing a light emitting element on at least one of the pair of leads from which the reflective film has been removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1:
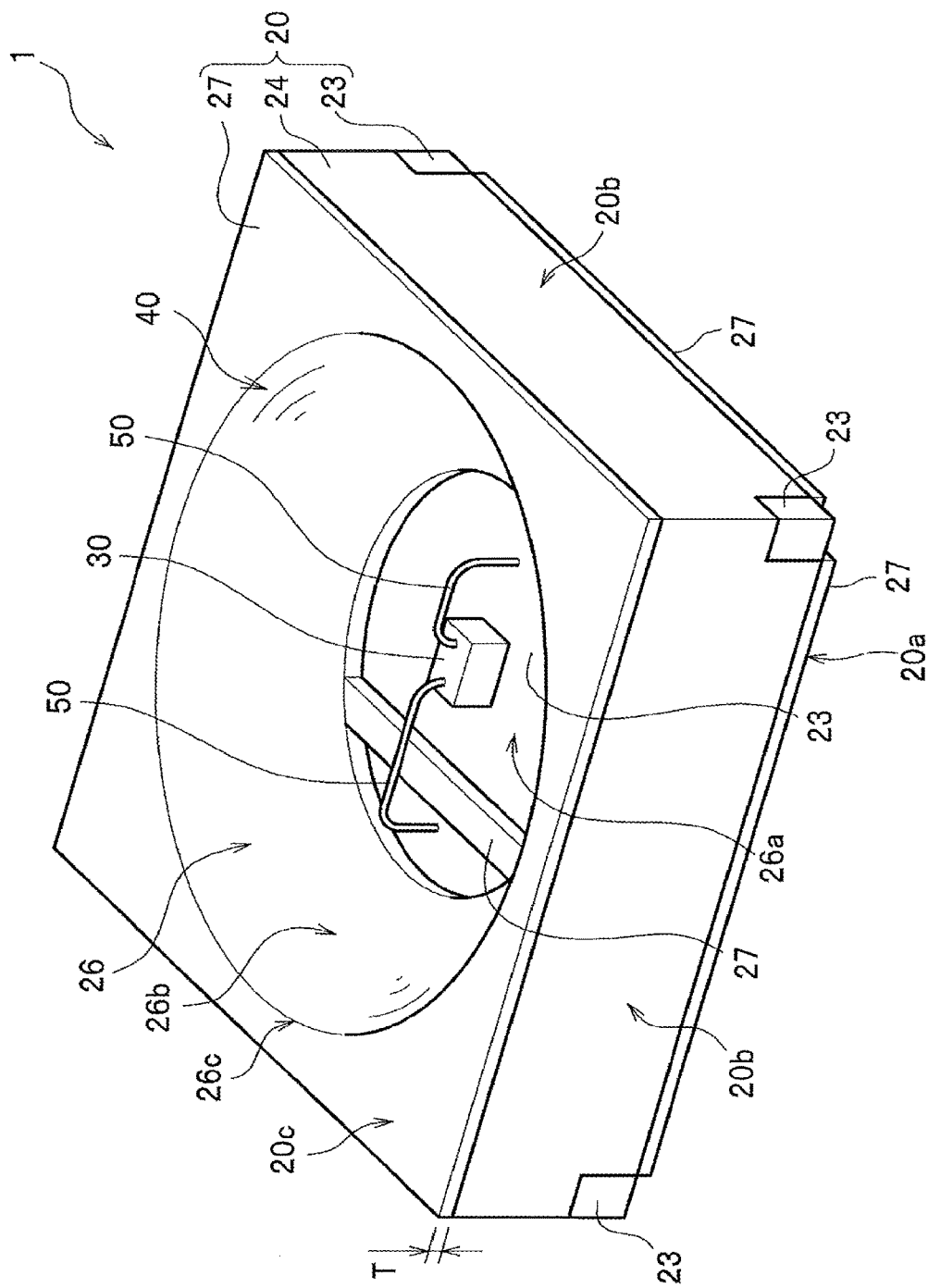
FIG. 1 is a diagram schematically illustrating a light-emitting device according to a first embodiment, and is a perspective view illustrating the light-emitting device.

The following describes exemplary embodiments of a package, a light-emitting device, and methods of manufacturing the package and the light-emitting device. Since the drawings referred to in the following description schematically illustrate the present embodiment, the scale of each member and an interval and a positional relation thereof may be exaggerated, or part of the members may be omitted in some cases. In the following description, an identical name and an identical reference numeral refer to an identical or similar member, and any duplicate detailed description thereof will be omitted as appropriate.

A package having a recess according to an embodiment of the present disclosure can comprise a pair of leads arranged at a bottom surface of the recess, a first resin body forming a lateral wall of the recess, a second resin body arranged between the pair of leads and a reflective film. The reflective film covers at least an inner surface of the lateral wall of the recess, and an upper surface and a lower surface of the second resin body.

A package and a light-emitting device according to embodiments of the present disclosure each include a highly accurately arranged reflective film. A method of manufacturing a package and a method of manufacturing a light-emitting device according to embodiments of the present disclosure can form a highly accurately arranged reflective film.

In addition, in a package according to an embodiment of the present disclosure, the reflective film can further cover an upper surface of a peripheral part of an opening of the recess.

In addition, in a package according to an embodiment of the present disclosure, the first resin body and the second resin body can be entirely covered by the reflective film.

In a package according to an embodiment of the present disclosure, the reflective film can be formed up to boundaries the pair of leads and the inner surface of the lateral wall of the recess. The reflective film can be formed up to boundaries the pair of leads and the upper surface of the second resin body, and the reflective film can be formed up to boundaries the pair of leads and the lower surface of the second resin body.

In addition, in a package according to an embodiment of the present disclosure, the reflective film can have an average thickness of 10 to 1000 nm.

In addition, in a package according to an embodiment of the present disclosure, the reflective film can mainly include metallic oxide having a particle diameter of 1 to 100 nm.

Further, in a package according to an embodiment of the present disclosure, the metallic oxide can be titanium oxide.

Furthermore, in a package according to an embodiment of the present disclosure, the first resin body and the second resin body can include at least one selected from the group consisting of epoxy resin, modified epoxy resin, silicone resin, modified silicone resin, acrylate resin, and urethane resin.

Moreover, in a package according to an embodiment of the present disclosure can further comprise an element mounting part on which a light emitting element is mounted.

A ceramic package having a recess according to an embodiment of the present disclosure can comprise a pair of conductive wirings arranged at a bottom surface of the recess, a first ceramic body forming a lateral wall of the recess, a second ceramic body arranged between the pair of conductive wirings, and a reflective film. The reflective film covers at least an inner surface of the lateral wall of the recess, and an upper surface and a lower surface of the second ceramic body.

A light-emitting device according to an embodiment of the present disclosure can comprise the package having the pair of leads and a light emitting element. The light emitting element can be arranged on at least one of the pair of leads located at the bottom surface of the recess of the package.

A light-emitting device according to an embodiment of the present disclosure can comprise the package having the element mounting part and a light emitting element. The light emitting element can be disposed on the element mounting part located at the bottom surface of the recess of the package, and can be electrically connected with the pair of the leads.

A light-emitting device according to an embodiment of the present disclosure can comprise the ceramic package having the pair of conductive wirings and a light emitting element. The light emitting element can be arranged on at least one of the pair of conductive wirings located at the bottom surface of the recess of the ceramic package.

A light-emitting device according to an embodiment of the present disclosure can further comprise a third resin body. The third resin body can cover the light emitting element mounted in the recess of the package.

First Embodiment
Configuration of Light-Emitting Device

Figure 2:
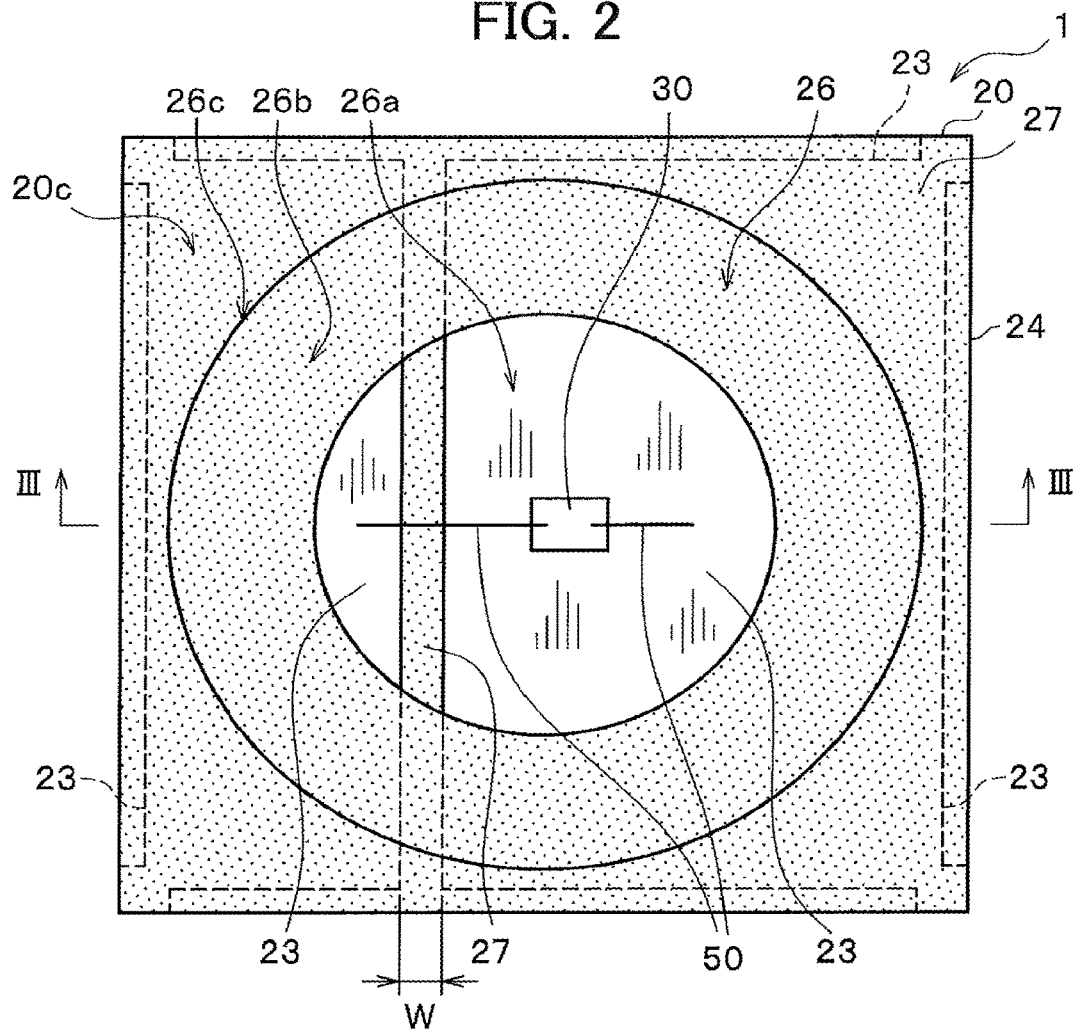
FIG. 2 is a diagram schematically illustrating the light-emitting device according to the first embodiment, and is a top view of the light-emitting device.
Figure 3:
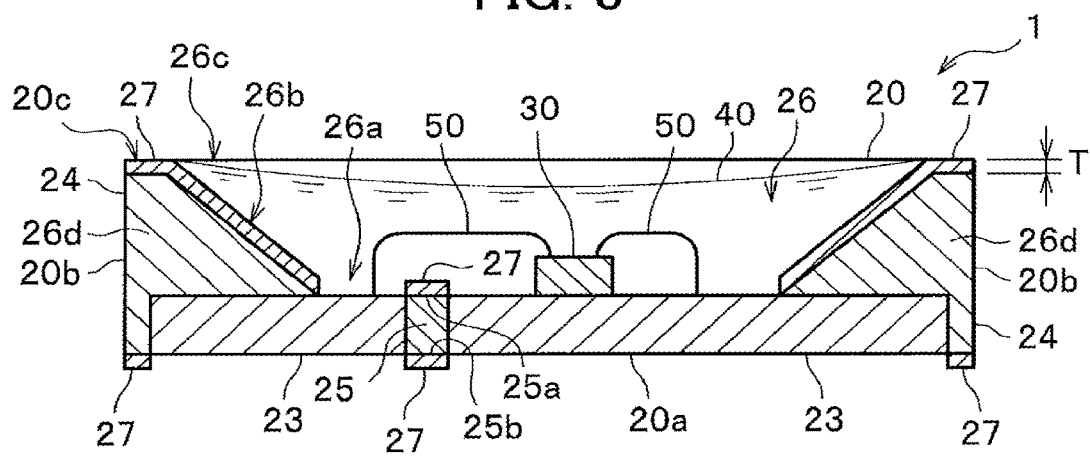
FIG. 3 is a diagram schematically illustrating the light-emitting device according to the first embodiment, and is a sectional view taken along line III-III in FIG. 2.

The following description will be made with reference to the drawings. FIG. 1 is a diagram schematically illustrating a light-emitting device according to a first embodiment, and is a perspective view illustrating the light-emitting device. FIG. 2 is a diagram schematically illustrating the light-emitting device according to the first embodiment, and is a top view of the light-emitting device. FIG. 3 is a diagram schematically illustrating the light-emitting device according to the first embodiment, and is a sectional view taken along line III-III in FIG. 2.

This light-emitting device 1 according to the first embodiment includes a package 20 including a first resin body 24 and a second resin body 25, a light emitting element 30, a third resin body 40, and a pair of wires 50.

Configuration of Package

The package 20 includes a pair of leads 23, the first resin body 24, the second resin body 25, and a reflective film 27, and the pair of leads 23, the first resin body 24, and the second resin body 25 are integrated with each other.

The entire shape of the package 20 is a substantially rectangular parallelepiped, an upper surface of which is a square. The package 20 has outer surfaces including a lower surface 20a, four lateral surfaces 20b, and an upper surface 20c. The height, length, and width of the package 20 are not particularly limited, but can be selected as appropriate depending on a purpose and a usage. The shape of the package 20 may be a substantially polygonal shape such as a cube or a hexagonal column.

The lower surface 20a of the package 20 serves as a mount surface for, for example, an external mount substrate. The lower surface 20a includes the reflective film 27 formed on a lower surface of the first resin body 24 and on a lower surface 25b of the second resin body 25, and the pair of leads 23 exposed from the reflective film 27. The pair of leads 23 on the lower surface 20a is exposed from the reflective film 27 at a part except for a peripheral part (the lower surface of the first resin body 24) of the package 20 and a part in which the second resin body 25 is provided.

The lateral surface 20b of the package 20 includes the first resin body 24, and the lead 23 exposed at corners of the first resin body 24, and the shape of the exposed lead 23 is rectangle. In the package 20, the pair of leads 23 is exposed from the four corners. The first resin body 24 and the lead 23 on the lateral surface 20b are formed substantially on the same plane.

The upper surface 20c of the package 20 is formed in a rectangular shape in a plan view and includes an upwardly-opened recess 26 in a central part thereof. On the upper surface 20c, the reflective film 27 is provided on an upper surface of a peripheral part of an opening 26c of the recess 26, an inner surface 26b of the recess 26, and an upper surface 25a of the second resin body 25 arranged between a pair of the leads 23 at a bottom surface 26a of the recess 26.

Recess

The pair of leads 23 is exposed on the bottom surface 26a of the recess 26, and the light emitting element 30 is disposed on at least one of the pair of leads 23. The recess 26 includes a lateral wall 26d that is the first resin body 24. The lateral wall 26d has an outer surface serving as the lateral surface 20b of the package 20.

The inner surface 26b of the lateral wall 26d may be smoothly tilted, and provided with fine unevenness to have a light scattering shape.

The recess 26 has the opening 26c in a circular shape in a plan view. The opening 26c is illustrated in a circular shape, but may have, for example, a substantially elliptical shape or a substantially polygonal shape. The recess 26 is shaped such that the inner surface 26b of the lateral wall 26d expands toward the opening 26c.

Lead

The pair of leads 23 is arranged on the bottom surface 26a of the recess 26. The pair of positive and negative leads 23 are arranged separately from each other. The pair of the leads 23 serve as an anode electrode and a cathode electrode, respectively, and have different conductivities.

The length, width, and thickness of each lead 23 are not particularly limited, and can be selected as appropriate depending on a purpose and a usage. The material of the lead 23 is preferably, for example, copper or copper alloy. The outermost surface of the lead 23 is preferably covered by a metal material having a high reflectance, such as silver or aluminum.

In the present embodiment, an upper surface and a bottom surface of the lead 23 are plated.

Plating is provided on an upper surface of each lead 23 (the bottom surface 26a of the recess 26), which achieves an improved reflectance for light from the light emitting element 30.

Plating is provided on a bottom surface of the lead 23 (the lower surface 20a of the package 20), which achieves an increased bonding strength with a conductive member such as solder.

In the present embodiment, plating is not provided on a surface of the lead 23, which is exposed from the lateral surface 20b. This is because this surface is a cut surface obtained at dicing a molding substrate into the package 20 as described later.

First Resin Body and Second Resin Body

The first resin body 24 fixes the pair of leads 23 and serves as the lateral wall 26d of the recess 26. The second resin body 25 is arranged between the pair of the leads 23. The first resin body 24 and the second resin body 25 are integrally formed from the same resin. In the following, first resin refers to resin included in the first resin body 24 and the second resin body 25.

Examples of the first resin include thermoplastic resin and thermosetting resin.

The thermoplastic resin may be, for example, polyphthalamide resin, liquid crystal polymer, polybutylene terephthalate (PBT), or unsaturated polyester.

The thermosetting resin may be, for example, epoxy resin, modified epoxy resin, silicone resin, modified silicone resin, urethane resin, or acrylate resin.

The first resin may contain light reflecting member to efficiently reflect light at the inner surface 26b of the lateral wall 26d of the recess 26. The light reflecting member preferably is, for example, titanium oxide, zinc oxide, zirconium oxide, aluminum oxide, silicon oxide, glass filler, silica, magnesium oxide, antimony oxide, aluminum hydroxide, barium sulfate, magnesium carbonate, or barium carbonate, which is relatively stable with liquid and the like and has a high refractive index and a high thermal conductivity.

Reflective Film

The reflective film 27 is provided on the upper surfaces and lower surfaces of the first resin body 24 and the second resin body 25. Specifically, the reflective film 27 is provided to cover at least the inner surface 26b of the lateral wall 26d of the recess 26, and the upper surface 25a and the lower surface 25b of the second resin body 25. The amount of light from the light emitting element 30 is relatively large on a part in which the reflective film 27 is formed, and thus providing the reflective film 27 in this part can contribute particularly on an improved light outputting efficiency from a front side of the light-emitting device 1. The pair of the exposed leads 23 is not covered by the reflective film 27.

In the present embodiment, the first resin body 24 is not covered by the reflective film 27 on the lateral surface 20b of the package 20. This is because the lateral surface 20b is a cut surface obtained at dicing of the molding substrate into the package 20 as described later.

The reflective film 27 is a thin film containing light reflecting particles. The reflective film 27 can be formed by drying dispersion liquid obtained by dispersing the light reflecting particles in organic solvent. The content rate of a light reflecting member in the dispersion liquid may be, for example, 1 to 30% by weight.

The organic solvent is not particularly limited, and may be, for example, ethanol, isopropyl alcohol, xylene, toluene, acetone, terpineol, diethylene glycol monobutyl ether, hexane, tridecane, propylene glycol monomethyl ether acetate (PGMEA), methyl isobutyl ketone (MIBK), or methyl ethyl ketone. The organic solvent may be a mixed solution of one or more kinds of solvents to adjust a wettability with a base material.

The light reflecting member is preferably a material having a high refractive index in a visible light range, for example, a metallic oxide such as $TiO_2$ (titanium oxide), $Al_2O_3$ (aluminum oxide), $ZrO_2$ (zirconium oxide), or ZnO (zinc oxide), or a white pigment such as glass filler or $SiO_2$ (silicon oxide). The light reflecting member preferably has a refractive index of 1.4 to 2.8, and more preferably has a refractive index of 1.5 to 2.8. Among the materials listed above, titanium oxide having a high refractive index is preferred because of its favorable reflectivity in the visible light range. The first resin body 24 and the second resin body 25 on which a reflective film of the light reflecting member is formed preferably have a reflectance of not lower than 70% or 80% for visible light. In particular, the first resin body 24 and the second resin body 25 preferably have a reflectance of not lower than 70% or 80% in a wavelength band emitted by the light emitting element. The white pigment such as titanium oxide included in the light reflecting member only needs to have a content of 50% by weight to 95% by weight, both inclusive, and preferably has, but is not limited to, a content of 60% by weight to 95% by weight.

The light reflecting particles are preferably nano particles having an average particle size of 1 to 1000 nm, preferably 5 to 300 nm, more preferably 10 to 200 nm. The use of the nano particles enables formation of the reflective film 27 that is thin and has a high reflectance, and thus the nano particles are preferable for reducing the thickness of the light-emitting device 1. The dispersion liquid of the nano particles is dried to form the reflective film 27 that is a fine film unlikely to become separate off the surfaces of the first resin body 24 and the second resin body 25, thereby achieving the highly reliable light-emitting device 1.

The nano particles preferably have an average particle size of 1 to 100 nm, more preferably 1 to 50 nm, to achieve a favorable light reflectivity and a favorable adhesion with the first resin body 24 and the second resin body 25.

In the present specification, the particle diameter of the nano particles is an average particle diameter measured by laser diffractometry. The size of the particles is a reference size based on the number of measured particles (number distribution).

The light reflecting member contained in the reflective film 27 and the light reflecting member contained in the first resin body 24 and the second resin body 25 may be materials of the same kind or different kinds, and the particle sizes of these materials may be the same or different.

In the light-emitting device in which short sides of the periphery of the package in a plan view have lengths of, for example 100 to 200 μm, if the reflective film provided to the recess wherein the light emitting element is disposed has a film thickness of 10 μm approximately, this reflective film reduces the size of the recess. Thus, only a relatively small light emitting element having a low outputting power can be disposed in the recess, and consequently, the light-emitting device emits relatively dark light.

A wire connecting an anode electrode to a cathode electrode on the bottom surface of the recess wherein the light emitting element is disposed and covered by a sealing member cannot have a smooth shape if a reflective film provided on a resin part arranged between these electrodes has a large thickness. If the reflective film has a thickness of 10 μm approximately, the wire is sharply bent, and thus the sealing member contracts and expands due to heat to apply a stress to cause break and disconnection of the wire, and ripping of a connection part thereof.

Thus, in the package 20 according to the present embodiment, the reflective film 27 has an average thickness T of 10 to 1000 nm, preferably 10 to 500 nm, more preferably 50 to 200 nm, to enable formation at a constant film thickness and obtain a favorable reflectivity. Accordingly, in the light-emitting device 1, the light emitting element 30 that is relatively large and has a high outputting power can be disposed in the recess 26 of the package 20, and thus the light-emitting device 1 can emit relatively bright light. When the reflective film 27 formed on the upper surface 25a of the second resin body 25 is set to have a film thickness in the above-described range, the wire 50 connecting the anode electrode to the cathode electrode on the bottom surface 26a of the recess 26 can be maintained in a smoothly bent shape. In the formation of the reflective film 27, a thin film having a thickness of 10 to 500 nm approximately can be easily formed by drying dispersion liquid containing a high concentration of nano particles.

When the package 20 is connected to an external mount substrate by, for example, soldering, a solder layer is bonded on the lower surface 20a of the package 20. If the reflective film 27 is not provided on the surface of the second resin body 25, light having transmitted through the second resin body 25 is absorbed in the solder layer and cannot be externally output. However, the package 20 according to the present embodiment can reduce the absorption of light in the second resin body 25 because the reflective film 27 is provided on the upper surface 25a and the lower surface 25b of the second resin body 25, and can achieve an increased light outputting efficiency because any small amount of light absorbed in the second resin body 25 is reflected upward by the reflective film 27 on the lower surface 25b of the second resin body 25.

Light Emitting Element

The light emitting element 30 is arranged on at least one of the pair of the leads 23 on the bottom surface 26a of the recess 26 of the package 20. The light emitting element 30 is electrically connected with the pair of leads 23 through the wire 50. The shape, size, and the like of the light emitting element 30 arranged in this manner are not particularly limited. The color of light emitted from the light emitting element 30 can be selected at an optional wavelength in accordance with a usage. For example, a light emitting element for blue (light having a wavelength 430 to 490 nm) may be a GaN-based or InGaN-based element. The InGaN-based element may be, for example, $In_XAl_YGa_{1-X-Y}N$ ($0 \leq X \leq 1$, $0 \leq Y \leq 1$, $X+Y<1$). The light emitting element 30 may have a face-up structure or a face-down structure.

Third Resin Body

The third resin body 40 covers the light emitting element 30 and the like mounted in the recess 26 of the package 20. The third resin body 40 is provided to protect the light emitting element 30 and the like from, for example, an external force, dust, and moisture, and to achieve a favorable heat resistance, a weather resistance, and a light resistance of the light emitting element 30 and the like.

Hereinafter, third resin refers to resin forming the third resin body 40. The third resin may be transparent thermosetting resin such as silicone resin, epoxy resin, and urea resin. In order to achieve a certain function, the third resin may contain, in addition to such a material, fillers such as a fluorescent member and a material having a high light reflectance.

The third resin, when mixed with, for example, a fluorescent member, can facilitate color tone adjustment of the light-emitting device 1.

A material having a high light reflectance, such as $SiO_2$, $TiO_2$, $Al_2O_3$, $ZrO_2$, or MgO, can be suitably used as the filler contained in the third resin. For example, organic and inorganic coloring dye and coloring pigment can be used to remove an undesired wavelength.

Wire

The wire 50 is a conductive wire for electrically connecting the lead 23 with electronic components such as the light emitting element 30 and a protection element. Examples of the material of the wire 50 include metals such as Au (gold), Ag (silver), Cu (copper), Pt (platinum), Al (aluminum), and alloys thereof, but in particular, Au having an excellent thermal conductivity and the like is preferably used. The diameter of the wire 50 is not particularly limited, but can be selected as appropriate depending on a purpose and a usage.

Other Components

The light-emitting device 1 may include a zener diode as the protection element. The zener diode may be disposed separately from the light emitting element 30 and on the lead 23 at the bottom surface 26a of the recess 26. The zener diode may be disposed on the lead 23 at the bottom surface 26a of the recess 26, and the light emitting element 30 may be disposed above the zener diode.

Since the package 20 and the light-emitting device 1 according to the present embodiment each includes the highly accurately arranged reflective film 27, a larger amount of light from the light emitting element or the fluorescent member can be reflected and outputted toward a light-emitting upper surface than conventionally done. The light-emitting device 1 can achieve an increased light outputting efficiency and an enhanced light flux.

Method of Manufacturing Light-Emitting Device

The following describes a case in which multiple substrates for multiple light-emitting devices are manufactured as a collective substrate having an array of the substrates. A method of manufacturing a light-emitting device according to the first embodiment performs a process of preparing a resin compact as a collective substrate, a process of forming a reflective film, a process of removing part of the reflective film, a process of placing a light emitting element, a process of covering the light emitting element with the third resin, and a dicing process.

Process of Preparing Resin Compact

Figure 4:
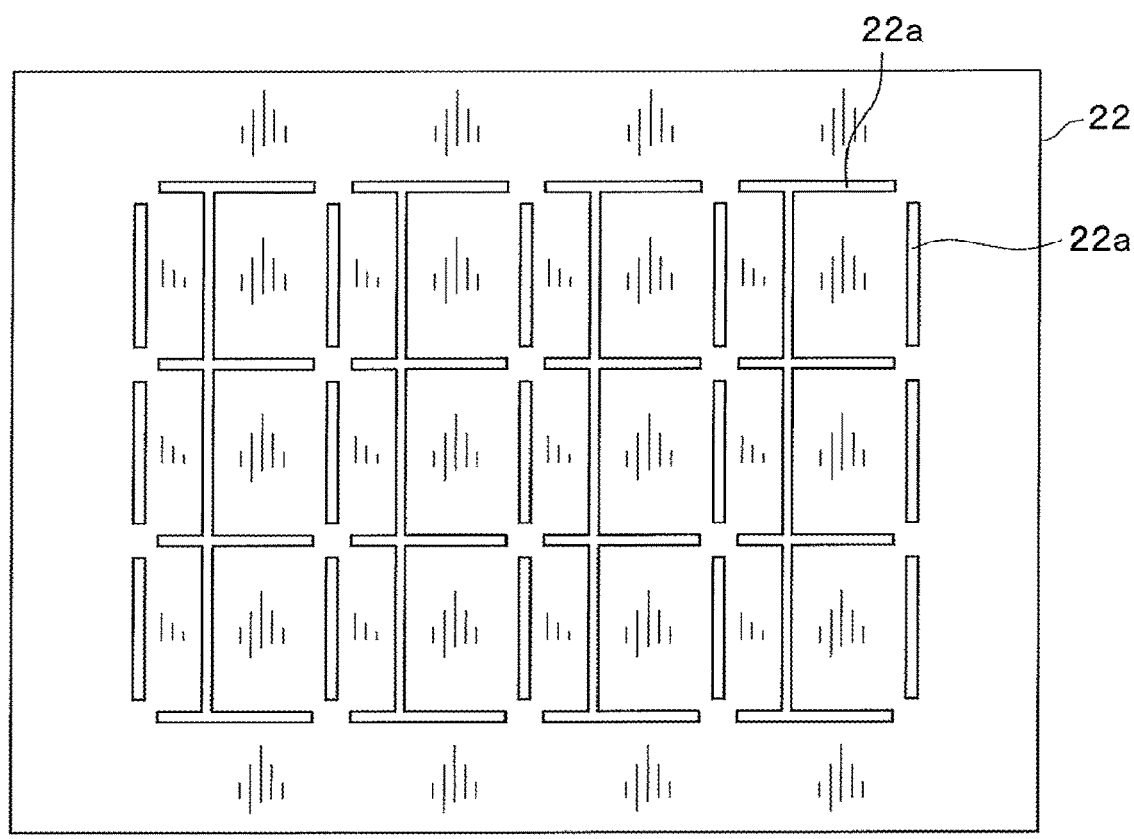
FIG. 4 is a diagram schematically illustrating the process of manufacturing a light-emitting device according to the first embodiment, and is a plan view of a lead frame.
Figure 5:
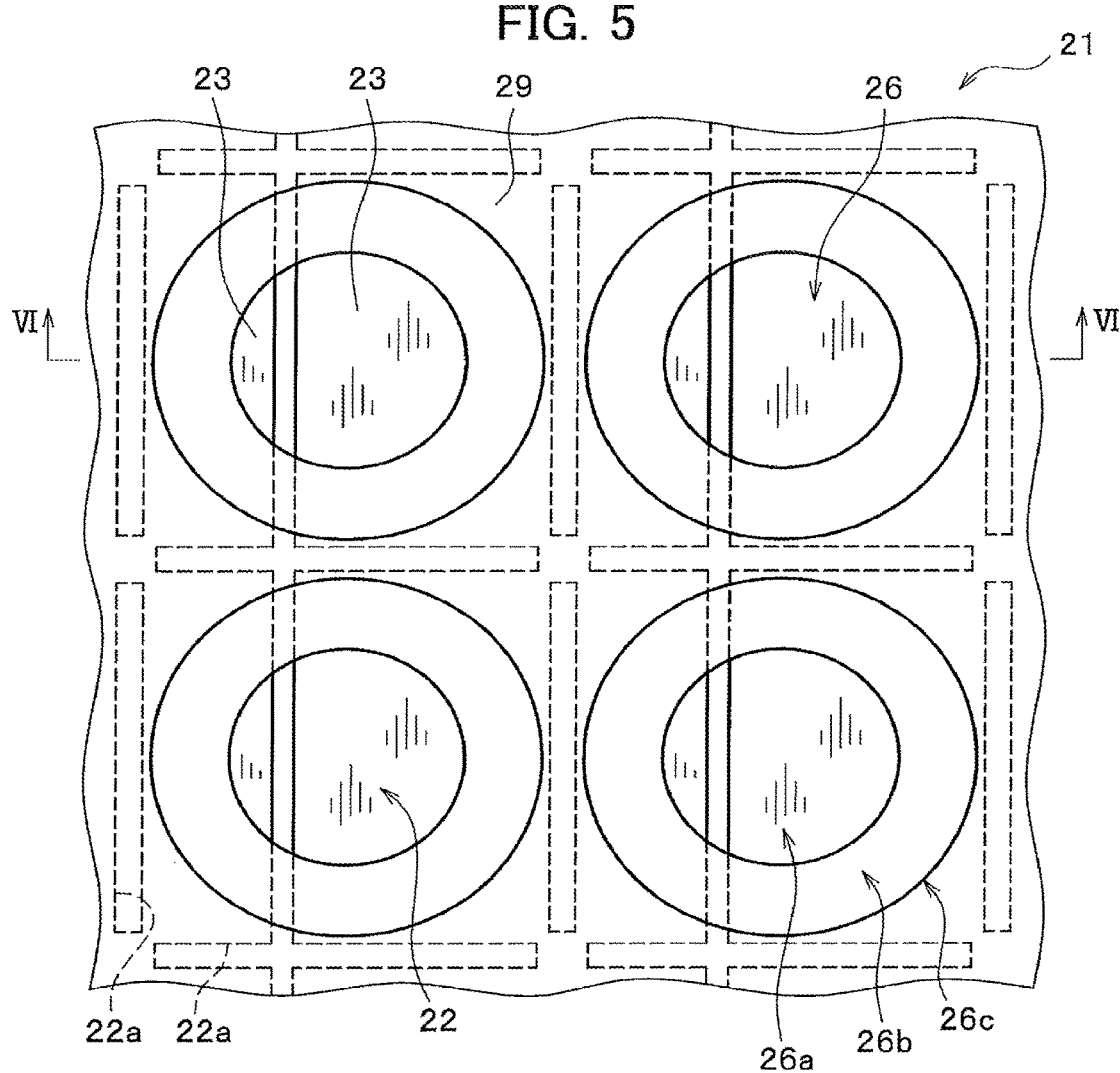
FIG. 5 is a diagram schematically illustrating the process of manufacturing the light-emitting device according to the first embodiment, and is a plan view of a resin compact.
Figure 6:
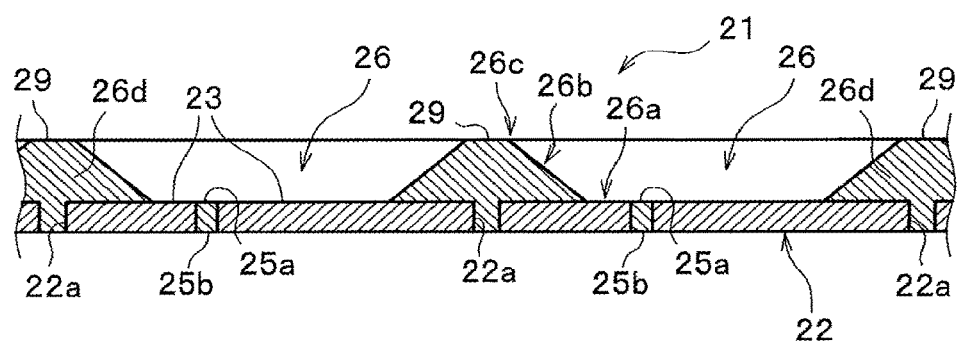
FIG. 6 is a diagram schematically illustrating the process of manufacturing the light-emitting device according to the first embodiment, and is a sectional view taken along line VI-VI in FIG. 5.

FIG. 4 is a diagram schematically illustrating the process of manufacturing a light-emitting device according to the first embodiment, and is a plan view of a lead frame. FIG. 5 is a diagram schematically illustrating the process of manufacturing the light-emitting device according to the first embodiment, and is a plan view of a resin compact. FIG. 6 is a diagram schematically illustrating the process of manufacturing the light-emitting device according to the first embodiment, and is a sectional view taken along line VI-VI in FIG. 5.

A resin compact 21 includes a lead frame 22, a resin part 29, and multiple recesses 26 for multiple light-emitting devices. The lead frame 22 includes through-holes 22a formed in a predetermined pattern. The predetermined pattern is divided in two lead regions that become electrodes when diced, and surrounds the lead regions while holding these two leads. Each through-hole 22a preferably has a straight line shape because the dicing is performed along the through-holes 22a. The lead frame 22 may be a flat metal plate, or a metal plate provided with a step or unevenness.

The lead frame 22 is obtained by performing, for example, punching fabrication or etching fabrication on the flat metal plate.

The through-holes 22a are formed such that the leads 23 are obtained as a pair of positive and negative leads when the resin compact 21 is diced to obtain the package 20. The through-holes 22a are formed such that an area in which the leads 23 are cut is reduced when the resin compact 21 is cut. For example, the through-holes 22a are provided in the lateral direction so that the pair of positive and negative leads 23 are obtained. Each elongate through-hole preferably has a width of (width W between the pair of leads 23) not larger than 1 mm, for example, 500 to 800 μm to achieve downsizing the package. The through-holes 22a are provided at positions corresponding to cut parts when the resin compact 21 is diced. However, parts of the lead frame 22 are coupled with each other to prevent falling off part of the lead frame 22 or to expose the leads 23 on the lateral surface 20b of the package 20. The resin compact 21 is diced by using, for example, a dicing blade 90 (refer to FIG. 14), and thus the through-holes 22a are preferably formed in a straight line along the longitudinal and lateral directions or an oblique direction. One package 20 has an area between the through-holes 22a at positions corresponding to parts where the dicing is performed.

The lead frame 22 is formed of a good electric conductor such as copper or copper alloy. Metal plating with, for example, silver or aluminum can be provided to the lead frame 22 to increase the reflectance of light from the light emitting element 30. The metal plating is preferably provided before the lead frame 22 is put between an upper mold and a lower mold, for example, after the through-holes 22a are provided or after the etching processing is performed. Instead, the metal plating may be provided before the lead frame 22 is integrated with the resin part 29.

The leads 23 in the lead frame 22 correspond to the leads 23 after molding and after dicing. The leads 23 are arranged at the bottom surface 26a of the recess 26 after the dicing has been performed. The resin part 29 corresponds to the first resin body 24 and the second resin body 25 after molding and before the dicing. The first resin body 24 forms the lateral wall 26d of the recess 26 after the dicing. The second resin body 25 is arranged between the pair of the leads 23 after the dicing.

The process of manufacturing the resin compact 21 includes, for example, the following processes (1) to (5):

(1) Preparing the flat lead frame 22 having the through-holes 22a.
(2) Sandwiching the lead frame 22 between upper and lower molds as vertically divided molding molds.
(3) Injecting the material of the resin part 29, in other words, the first resin containing the light reflecting member such as titanium oxide into the mold.
(4) Curing or solidifying the injected first resin.
(5) Taking out the compact from the mold and cutting a gate mark of the first resin.

When a thermosetting resin is used as the first resin, the resin compact 21 is preferably manufactured by transfer molding. In this case, the resin compact 21 is subjected to heating in an oven to cure the thermosetting resin. The resin compact 21 may be formed by injection molding, compression molding, or extrusion molding.

Process of Forming Reflective Film

Figure 7:
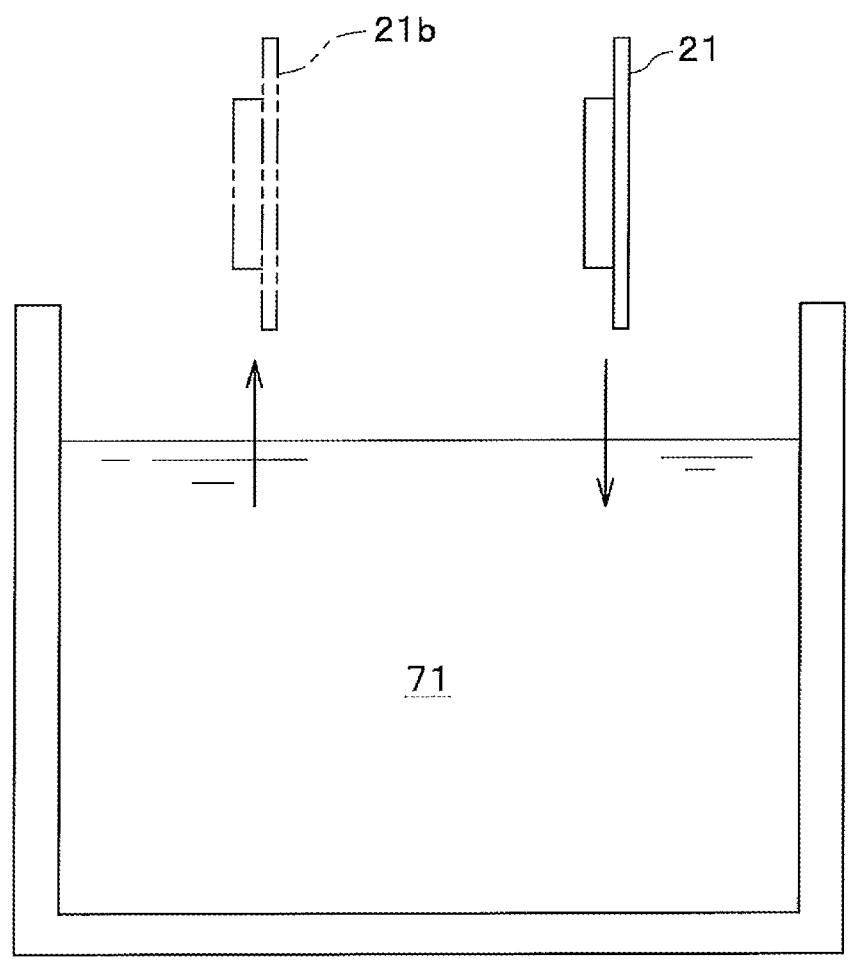
FIG. 7 is a diagram schematically illustrating the process of manufacturing the light-emitting device according to the first embodiment, and is a diagram illustrating an exemplary method of forming a reflective film.
Figure 8:
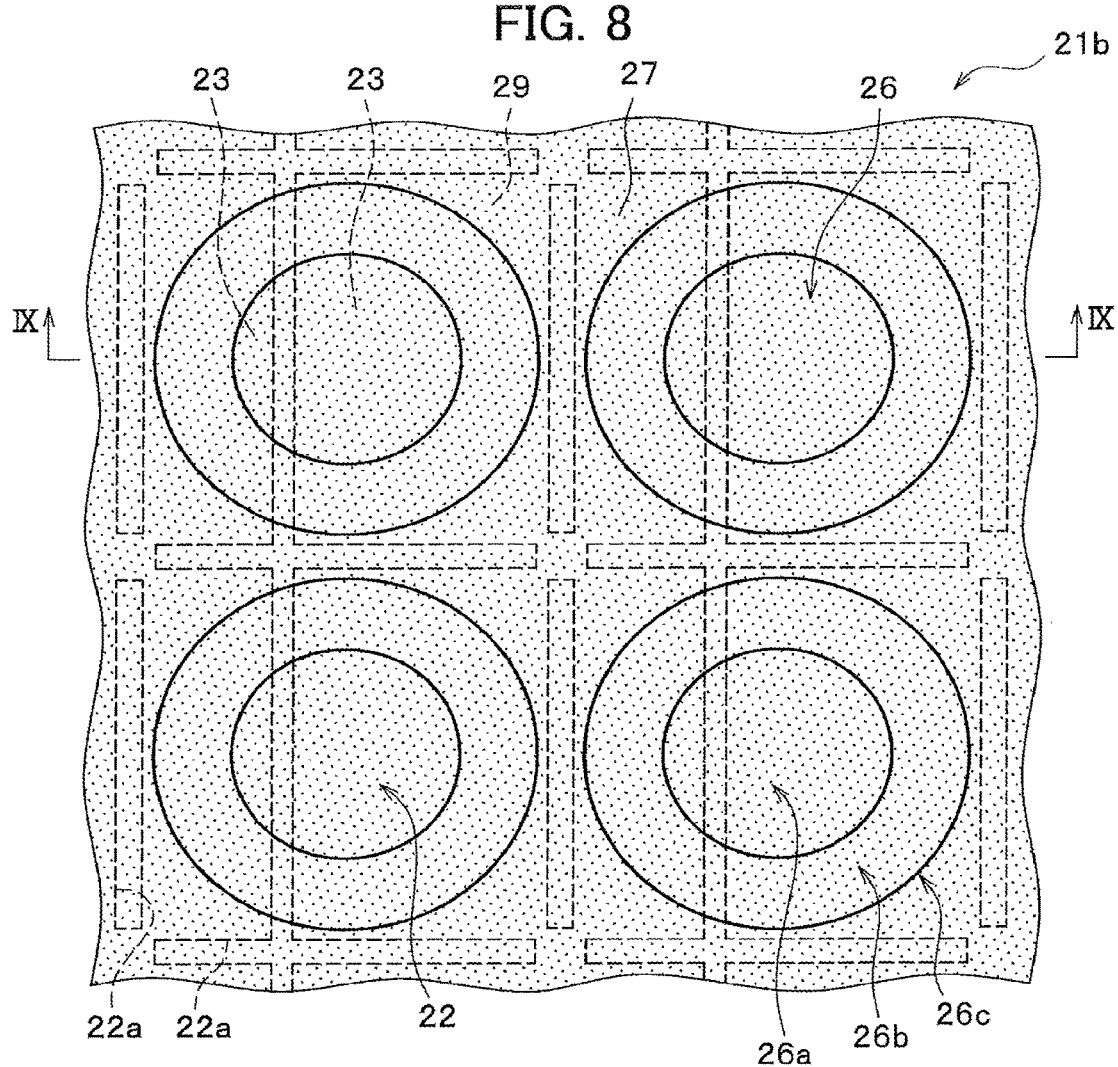
FIG. 8 is a diagram schematically illustrating the process of manufacturing the light-emitting device according to the first embodiment, and is a plan view of a molding substrate provided with the reflective film.
Figure 9:
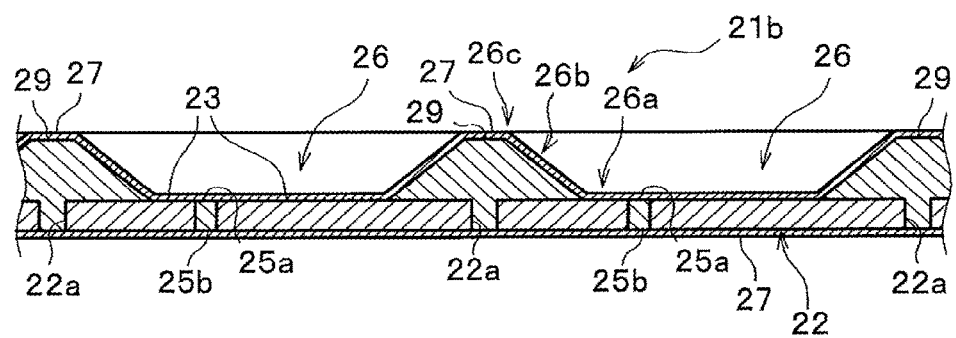
FIG. 9 is a diagram schematically illustrating the process of manufacturing the light-emitting device according to the first embodiment, and is a sectional view taken along line IX-IX in FIG. 8.

FIG. 7 is a diagram schematically illustrating the process of manufacturing the light-emitting device according to the first embodiment, and is a diagram illustrating an exemplary method of forming a reflective film. FIG. 8 is a diagram schematically illustrating the process of manufacturing the light-emitting device according to the first embodiment, and is a plan view of a molding substrate provided with the reflective film. FIG. 9 is a diagram schematically illustrating the process of manufacturing the light-emitting device according to the first embodiment, and is a sectional view taken along line IX-IX in FIG. 8.

The process of forming the reflective film 27 forms the reflective film 27 on at least the entire bottom surface 26a of the recess 26 and the entire inner surface 26b of the lateral wall 26d of the recess 26 in the package 20 after the dicing. The bottom surface 26a of the recess 26 corresponds to the upper surface 25a of the second resin body 25 in the package 20 after the dicing.

In the present embodiment, the prepared resin compact 21 is immersed in an organic solvent 71 as dispersion liquid of the light reflecting member and then dried to form the reflective film 27. An immersion time and a dry time can be set as appropriate so that the reflective film 27 having an average thickness T of 10 to 300 nm is formed on the resin compact 21. Slurry as an organic solvent in which light reflecting particles (nano particles) are dispersed is used as the organic solvent 71. The organic solvent 71 mainly includes metallic oxide having a particle diameter of 1 to 100 nm. The nano particles are preferably of titanium oxide.

The resin compact 21 is coated with the slurry as the organic solvent in which the nano particles are dispersed in this manner, to highly accurately form the fine reflective film 27 following a complicated shape of the package. In other words, the reflective film 27 is formed on the resin compact 21 by using the dispersion liquid of the light reflecting member to selectively form the reflective film 27 including the light reflecting member on insulating parts such as the upper surface 25a of the second resin body 25 inside the recess 26 and the lower surface 25b of the second resin body 25.

Hereinafter, a resin compact 21b refers to the resin compact after the reflective film 27 has been formed. The resin compact 21b is provided with the reflective film 27 formed on its entire surface. In other words, the reflective film 27 is formed on the entire surfaces of the leads 23 and the first resin body 24 and the second resin body 25 in the package 20 after the dicing.

Process of Removing Part of Reflective Film

Figure 10:
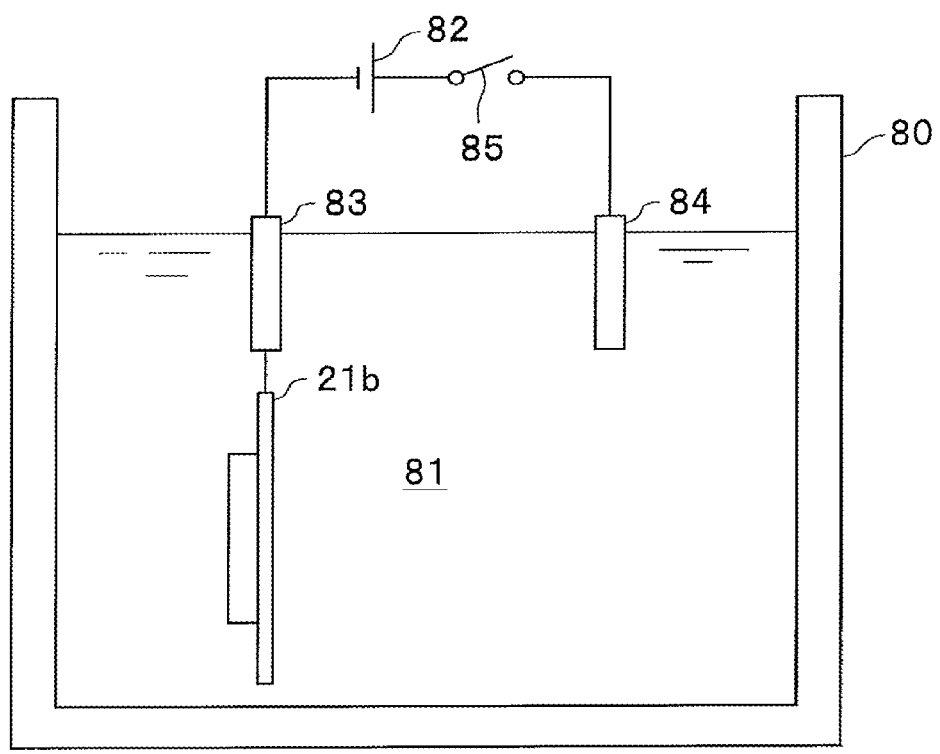
FIG. 10 is a diagram schematically illustrating the process of manufacturing the light-emitting device according to the first embodiment, and is a diagram illustrating an exemplary method of removing a reflective film.
Figure 11:
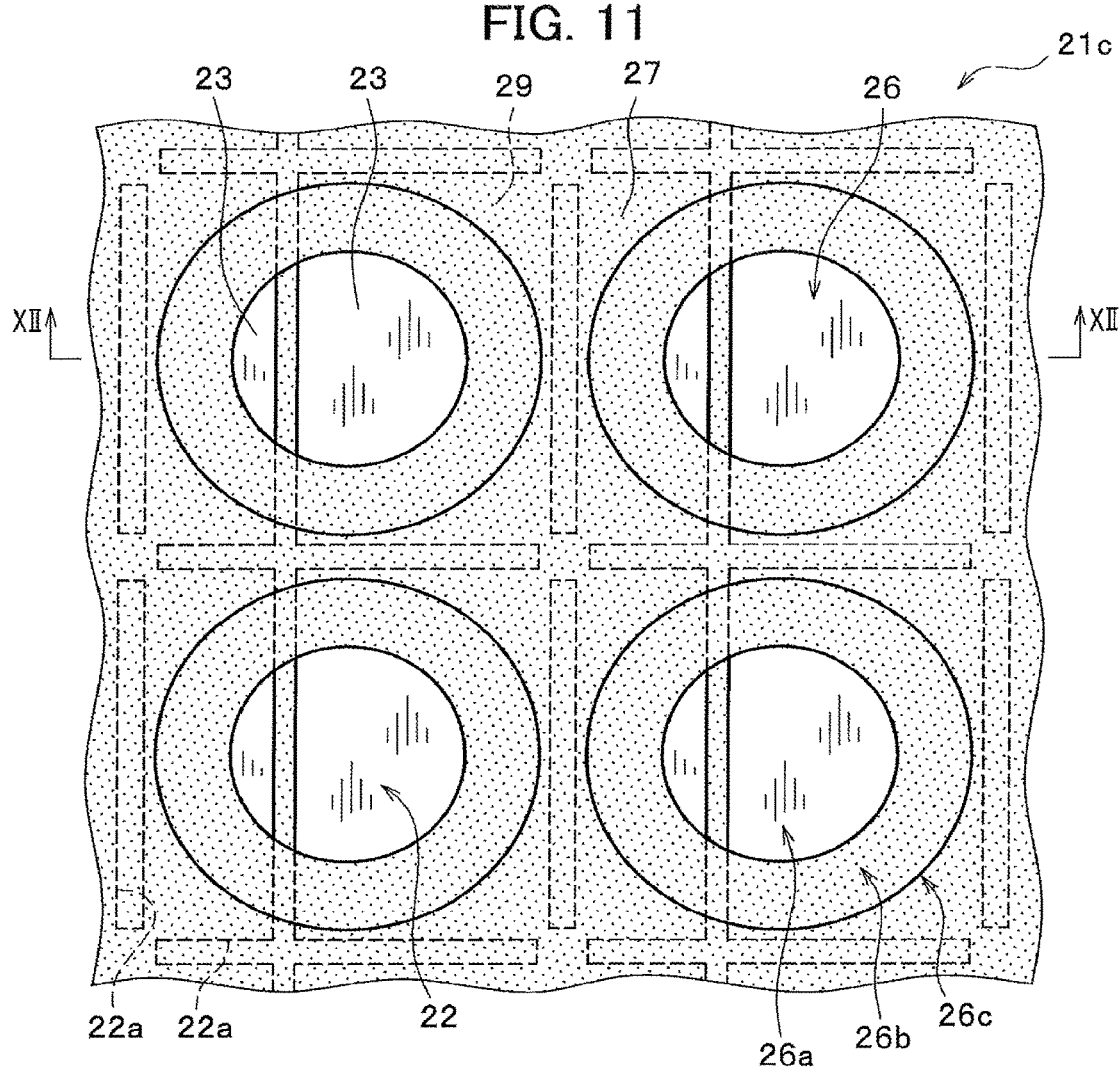
FIG. 11 is a diagram schematically illustrating the process of manufacturing the light-emitting device according to the first embodiment, and is a plan view of the molding substrate from which the reflective film is removed.
Figure 12:
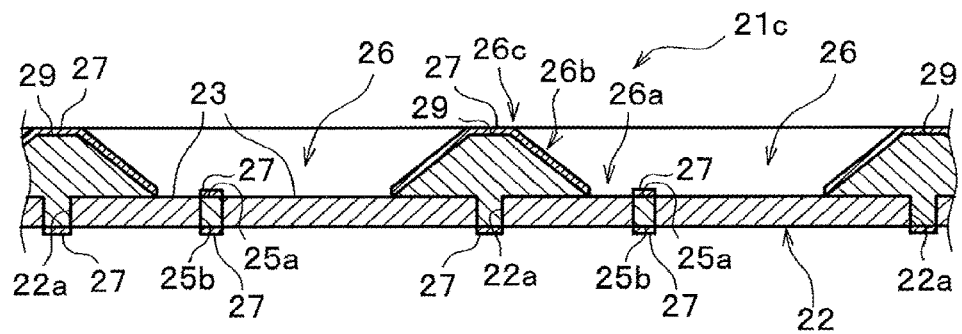
FIG. 12 is a diagram schematically illustrating the process of manufacturing the light-emitting device according to the first embodiment, and is a sectional view taken along line XII-XII in FIG. 11.

FIG. 10 is a diagram schematically illustrating the process of manufacturing the light-emitting device according to the first embodiment, and is a diagram illustrating an exemplary method of removing a reflective film. FIG. 11 is a diagram schematically illustrating the process of manufacturing the light-emitting device according to the first embodiment, and is a plan view of the molding substrate from which the reflective film is removed. FIG. 12 is a diagram schematically illustrating the process of manufacturing the light-emitting device according to the first embodiment, and is a sectional view taken along line XII-XII in FIG. 11.

The process of removing part of the reflective film 27 removes the reflective film formed on the pair of the leads 23 in the recess 26 in the resin compact 21b. In this process, first, a voltage is applied while the resin compact 21b is immersed in electrolyte solution to peel the reflective film 27 from the pair of the leads 23. For example, an electro-chemical deburring device can be used.

The electro-chemical deburring device includes an electrolytic bath 80 and an electronic circuit, and the electrolytic bath 80 is filled with a predetermined electrolyte solution 81. A cathode of a power source 82 is connected with cathode plates 83, an anode of the power source 82 is connected with anode plates 84, and the cathode plates 83 and the anode plates 84 are immersed in the electrolyte solution 81. Either of the cathode plates 83 and the anode plates 84 are arranged in a lattice while, for example, being insulated from each other, and each of the cathode plates 83 has a function of holding an electrolytic treatment target. The lead frame 22 of the resin compact 21b is electrically connected with the cathode plates 83. The resin compact 21b is held by the cathode plates 83 while being entirely immersed in the electrolyte solution 81.

When a switch 85 of the electro-chemical deburring device is turned on, hydrogen is generated at the cathode plates 83 by electrolysis. The value of current flowing in the resin compact 21b may be a typical value for the electro-chemical deburring device, but the direct current voltage to the resin compact 21b is preferably applied at a current density of 500 A/m$^2$ to 3000 A/m$^2$ to efficiently remove an unnecessary part of the reflective film 27 while leaving necessary part of the reflective film 27 intact. More preferably, the current density is 1000 A/m$^2$ to 2500 A/m$^2$.

In electro-chemical deburring, potential is generated at part of the reflective film 27 formed on the leads 23, and thus hydrogen is generated and the reflective film 27 on the surfaces of the leads 23 are removed accordingly. However, no potential is generated at part of the reflective film 27 formed on the first resin body 24 and the second resin body 25, and thus no hydrogen is generated and the reflective film 27 on the surfaces does not removed.

Direct current and alternating current may be alternately applied to the resin compact 21b. In this case, duration in which to apply the direct current is set to be longer than duration in which to apply the alternating current. In this manner, duration in which to generate no hydrogen is provided within duration in which to generate hydrogen, which can reduce a force for removing the reflective film 27. This can prevent a necessary part of the reflective film 27 from being removed along with a neighboring unnecessary part of the reflective film 27.

In the process of removing part of the reflective film 27, the electro-chemical deburring is followed by the process of removing the reflective film floating above the pair of the leads 23 of a resin compact 21c. In this process, for example, a waterjet process may be employed. This leads to an improved reliability of mounting and wire bonding of an electronic component such as the light emitting element 30 to be described later. The process so far can form an aggregate of the packages 20 each provided with, on the surface of a resin part, the fine reflective film 27 having a complicated shape, a high accuracy, and a high reflectance. In this example, the shape of the leads 23 exposed from the first resin body 24 includes a circle and a straight line, but the reflective film 27 having a complicated shape such as a curved shape, a wavy shape, or a concavo-convex shape in a plan view can be highly accurately formed.

Hereinafter, the resin compact 21c refers to a resin compact after an unnecessary part of the reflective film 27 has been removed. FIG. 1 illustrates the package 20 when this resin compact 21c is diced. In this package 20, the reflective film 27 is formed up to boundaries with the pair of leads 23 on the inner surface 26b of the lateral wall 26d of the recess 26. The reflective film 27 is formed up to boundaries the pair of leads 23 and the upper surface 25a of the second resin body 25. The reflective film 27 is formed up to boundaries the pair of leads 23 and the lower surface 25b of the second resin body 25. The reflective film 27 is formed up to boundaries with the pair of leads 23 and the lower surface of the first resin body 24 on the lower surface 20a of the package 20. In addition, the reflective film 27 is formed along boundaries between the first resin body 24 and the leads 23.

Process of Placing Light Emitting Element

Figure 13:
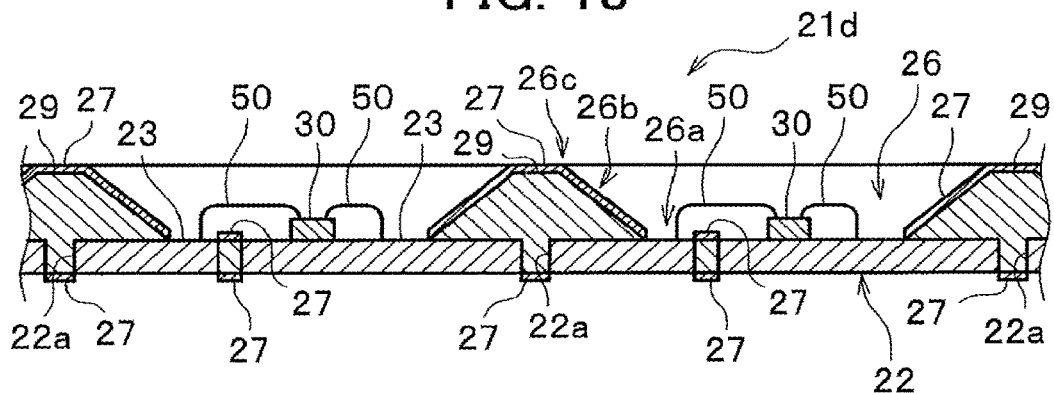
FIG. 13 is a diagram schematically illustrating the process of manufacturing the light-emitting device according to the first embodiment, and is a sectional view of the molding substrate on which the light emitting element is disposed.

FIG. 13 is a diagram schematically illustrating the process of manufacturing the light-emitting device according to the first embodiment, and is a sectional view of the molding substrate on which the light emitting element is disposed. In the process of disposing the light emitting element 30, the light emitting element 30 is disposed on at least one of the pair of the leads 23 arranged in the recess 26 of the resin compact 21c. In this example, since the light emitting element 30 has a face-up structure, die bond resin is applied at a position where the light emitting element 30 is mounted on the lead 23, and the light emitting element 30 is mounted, followed by heating in an oven to cure the die bond resin.

The method of manufacturing the light-emitting device 1 may include a process of disposing a protection element. In this case, Ag paste is applied at a position where the protection element is mounted in the recess 26 of the resin compact 21c and then the protection element is mounted, followed by heating in an oven to cure the Ag paste.

Subsequently in the method of manufacturing the light-emitting device 1, a wire bonding device is used to electrically connect the light emitting element 30 and a pair of the leads 23 through the conductive wire 50. In a case in which the protection element is disposed, the protection element and the lead 23 are electrically connected. Hereinafter, a resin compact 21d refers to the resin compact after the light emitting element 30 has been mounted.

Process of Covering Light Emitting Element with Third Resin

Figure 14:
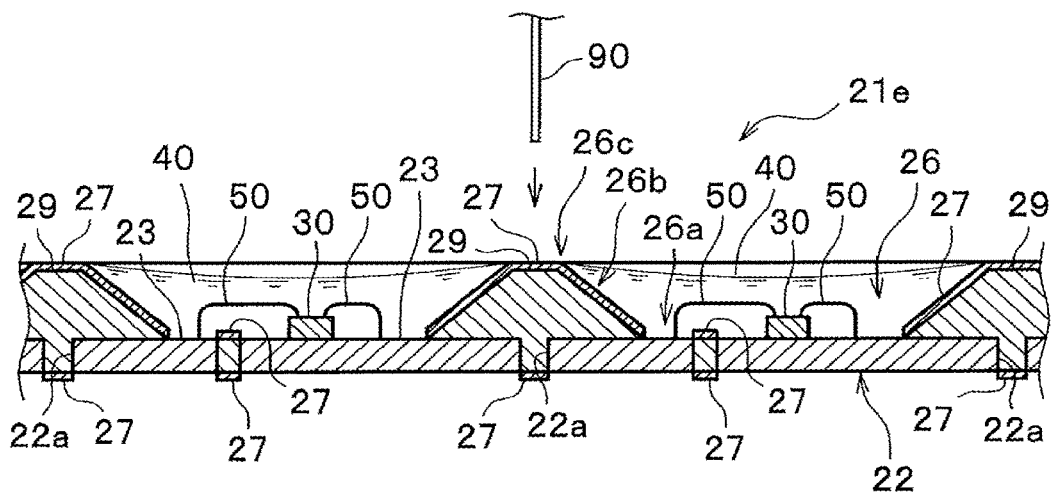
FIG. 14 is a diagram schematically illustrating the process of manufacturing the light-emitting device according to the first embodiment, and is a sectional view of the resin compact in which the light emitting element is covered by a third resin body.

FIG. 14 is a diagram schematically illustrating the process of manufacturing the light-emitting device according to the first embodiment, and is a sectional view of the resin compact in which the light emitting element is covered by the third resin body. In the process of covering the light emitting element with the resin, the third resin is applied over the light emitting element 30 in the resin compact 21d by using, for example, a resin applying device. The third resin may contain at least one of a fluorescent member, an inorganic filler, and an organic filler in addition to the thermosetting resin. Heating in an oven to cure the third resin is performed following the application.

The filling amount of the third resin may be any amount enough to cover an electronic component such as the light emitting element 30, and the wire 50. In order to minimize the filling amount of this material, the surface of the third resin body 40 is formed in a substantially flat shape as illustrated. In order to add a lens function to the third resin body 40, the surface of the third resin body 40 may be curved upward to have a bombshell shape or a convex lens shape. Hereinafter, a resin compact 21e refers to the resin compact after the third resin body 40 has been formed.

Dicing Process

The dicing process cuts the resin compact 21e to obtain a diced light-emitting device. The through-holes 22a are formed in a predetermined pattern in the lead frame 22 of the resin compact 21e, and the resin compact 21e is cut at positions passing through the through-holes 22a other than the through-holes 22a arranged in the recess 26. For example, the resin compact 21e is adhered to a dicing sheet to simultaneously cut the resin part 29 and the lead frame 22 of the resin compact 21e with the dicing blade 90.

In the methods of manufacturing the package and the light-emitting device according to the present embodiment, without using a mask, the prepared resin compact 21 is immersed in the organic solvent 71 as a dispersion liquid of the light reflecting member to form the reflective film 27 on the entire surface of the resin compact 21, and then an unnecessary part of the reflective film 27 is removed, thereby forming the reflective film 27 in a necessary area.

In the above-described manufacturing methods, the resin compact 21b in which the reflective film 27 formed on its entire surface is immersed in the electrolyte solution, and a direct current voltage is applied to the resin compact 21b connected with the cathodes, thereby easily removing any unnecessary part of the reflective film 27 from above the leads 23 due to generation of hydrogen. Thus, the reflective film 27 can be highly accurately formed up to the boundaries the pair of leads 23 and the second resin body 25 in minute areas such as the upper surface 25a and the lower surface 25b of the second resin body 25 arranged between the pair of leads 23. The reflective film 27 can be also formed along the boundaries with the first resin body 24 and the leads 23.

Second Embodiment

Figure 15:
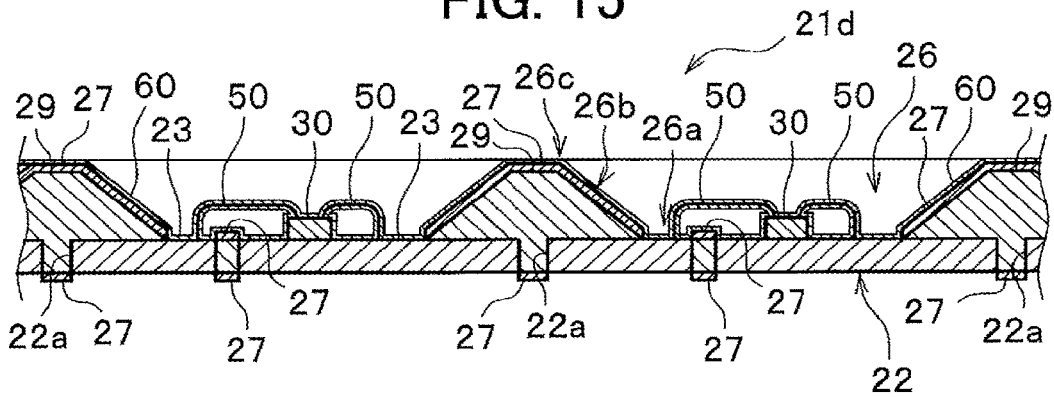
FIG. 15 is a diagram schematically illustrating a process of manufacturing the light-emitting device according to a second embodiment, and is a sectional view of a resin compact in which the light emitting element is covered by an insulating film.

FIG. 15 is a diagram schematically illustrating a process of manufacturing the light-emitting device according to a second embodiment, and is a sectional view of a resin compact in which the light emitting element is covered by an insulating film. The method of manufacturing the light-emitting device according to the present embodiment may further include a process of covering the light emitting element with the insulating film after the process of disposing the light emitting element and before the process of covering the light emitting element with the third resin.

In a case in which the wire 50 is used after the light emitting element 30 has been disposed, an insulating film 60 is preferably formed after the wire 50 has been provided. In the present embodiment, in the resin compact 21d after the light emitting element 30 has been mounted, the insulating film 60 is formed over the light emitting element 30 and the wire 50.

The insulating film 60 is preferably provided to cover substantially the entire upper surface of the resin compact 21d. The material of the insulating film 60 preferably has translucency and preferably includes an inorganic compound mainly. Specifically, examples of the material include oxides such as $Al_2O_3$, $SiO_2$, $TiO_2$, $ZrO_2$, $ZnO$, $Nb_2O_5$, $MgO$, $In_2O_3$, $Ta_2O_5$, $HfO_2$, $SeO$, and $Y_2O_3$, nitrides such as SiN, AlN, and AlON, and a fluoride such as $MgF_2$. These materials may be singularly used or mixed. Alternatively, layers of these materials may be stacked.

The insulating film 60 preferably has a film thickness small enough to prevent a loss of light due to multiple reflections at the interface between the third resin body 40 and the insulating film 60 and the interface between the insulating film 60 and the lead 23.

The film thickness of the insulating film 60 is smaller than the film thickness of the third resin body 40. The film thickness of the insulating film 60 is substantially constant. Although a preferable range of the film thickness is slightly different depending on the kind of a material used as the insulating film 60, the insulating film 60 preferably has a film thickness of 1 nm to 300 nm approximately, and more preferably has a film thickness of 5 nm to 100 nm. In a case in which multiple insulating films 60 are provided, the total film thickness of the insulating films 60 is preferably within the above-described range.

Such an insulating film 60 can be formed by, for example, atomic layer deposition (ALD), sputtering, or vapor deposition. Among these methods, the ALD is preferable because the ALD can form a fine coat having a high coatability of a shape including a step (unevenness), and a uniform thickness. In particular, a coat made of $Al_2O_3$ formed by the ALD is preferable because of its high barrier property against atmosphere such as moisture. This can achieve, for example, effective reduction in a color change of silver plating on the pair of leads 23.

Third Embodiment

Figure 16:
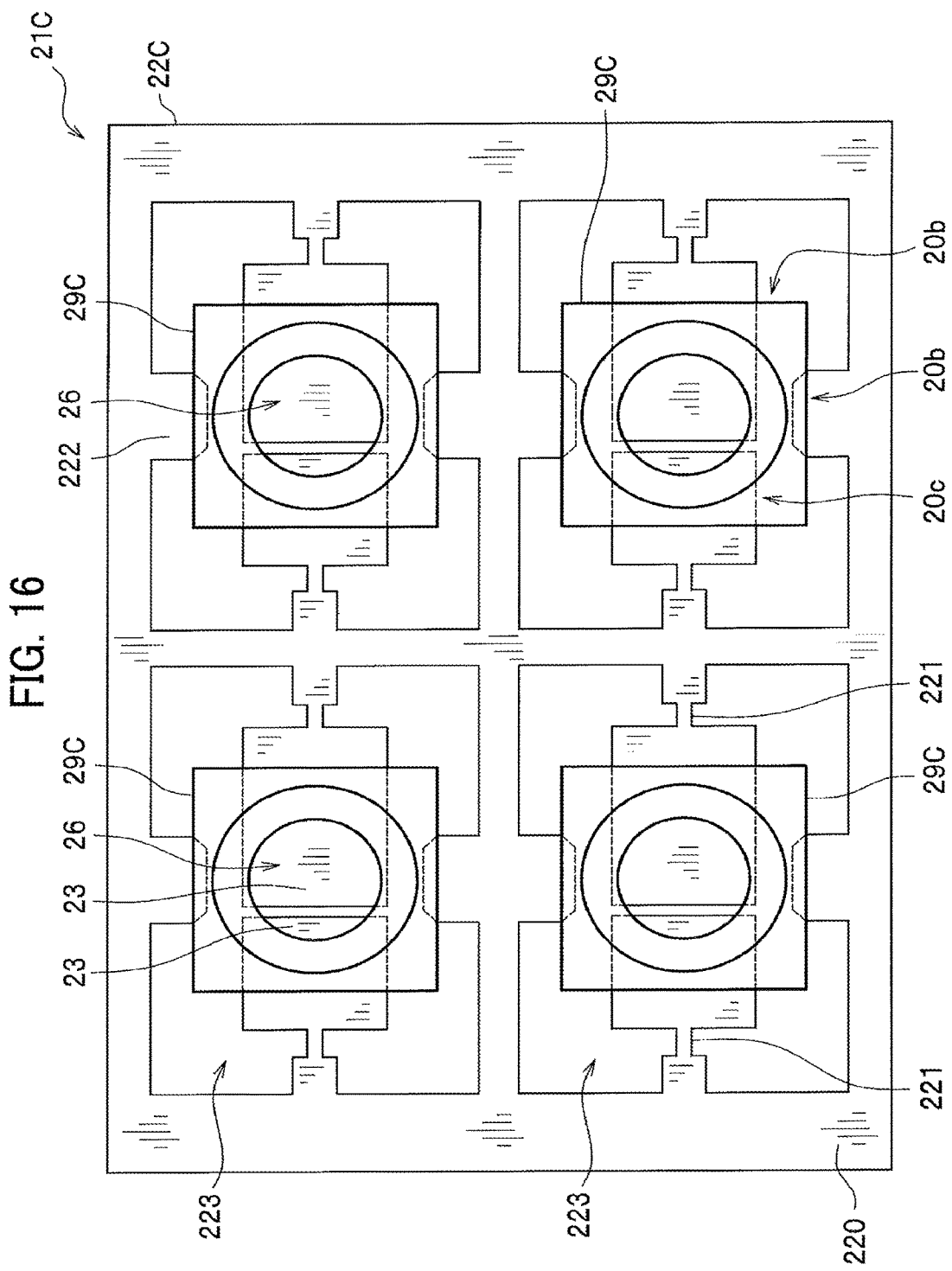
FIG. 16 is a diagram schematically illustrating a process of manufacturing the light-emitting device according to a third embodiment, and is a plan view of another resin compact.

FIG. 16 is a diagram schematically illustrating a process of manufacturing the light-emitting device according to a third embodiment, and is a plan view of another resin compact. In the methods of manufacturing the package and the light-emitting device according to the present embodiment, for example, a resin compact 21C illustrated in FIG. 16 may be prepared. The resin compact 21C includes a lead frame 22C and multiple resin parts 29C for individual packages, each resin part 29C including the recess 26. Since the resin parts 29C are diced parts in the resin compact 21C, only the lead frame 22C is cut in the dicing process.

The lead frame 22C is a plate member, and includes a through-hole 223 having a predetermined shape around each recess 26. The through-hole 223 is formed such that the leads 23 are obtained as a pair of positive and negative leads when the resin compact 21C is diced. The lead frame 22C includes a frame body 220 surrounding the through-hole 223, a suspension lead 221, and a hanger lead 222.

The suspension lead 221 protrudes toward the through-hole 223 from the frame body 220 and is connected with the lead 23. The suspension lead 221 is a part for supporting the resin parts 29C and the leads 23 to the frame body 220, and is cut at dicing.

The hanger lead 222 protrudes toward the through-hole 223 from the frame body 220 and is arranged in a direction orthogonal to the suspension lead 221. The hanger lead 222 is a part for supporting the resin parts 29C at its head part, and is not to be cut. A base end part of the hanger lead 222 is pushed by a predetermined jig after dicing to easily remove the package from the lead frame 22C.

Through the process of forming a reflective film using the resin compact 21C, the reflective film 27 is formed on the lateral surface 20b of each resin part 29C in addition to the upper surface 20c thereof. Thus, the first resin body 24 and the second resin body 25 in the package after dicing are entirely covered by the reflective film 27. Accordingly, the package and the light-emitting device in which the reflective film 27 is also formed on the lateral surface 20b can be manufactured. With this configuration, any small amount of light absorbed in the first resin body 24 through the inner surface 26b of the lateral wall 26d of the recess 26 is reflected by the reflective film 27 on the lateral surface 20b of the package, thereby achieving an increased light outputting efficiency.

Fourth Embodiment

Configuration of Light-Emitting Device

Figure 17:
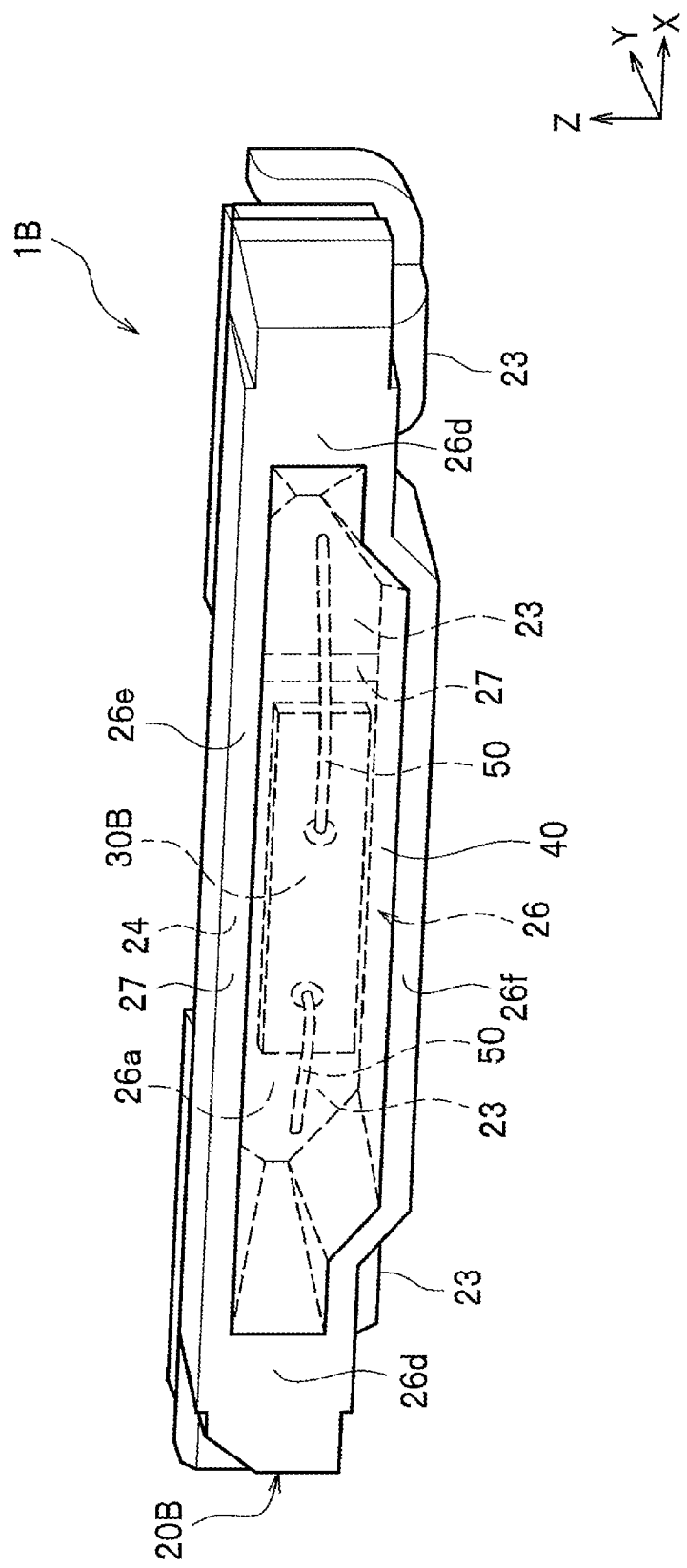
FIG. 17 is a diagram schematically illustrating a light-emitting device according to a fourth embodiment, and is a perspective view illustrating the light-emitting device.
Figure 18:
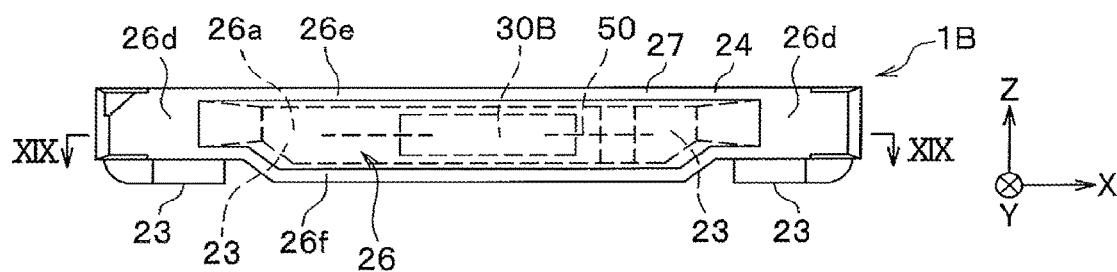
FIG. 18 is a diagram schematically illustrating the light-emitting device according to the fourth embodiment, and is a front view of the light-emitting device.
Figure 19:
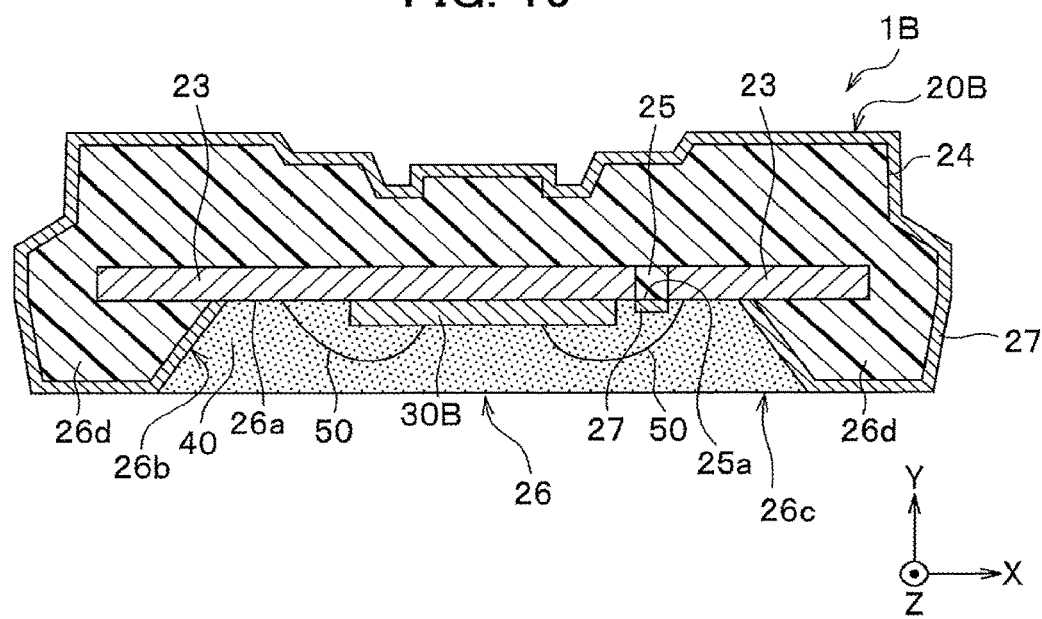
FIG. 19 is a diagram schematically illustrating the light-emitting device according to the fourth embodiment, and is a sectional view taken along line XIX-XIX in FIG. 18.

FIG. 17 is a diagram schematically illustrating a light-emitting device according to a fourth embodiment, and is a perspective view illustrating the light-emitting device. FIG. 18 is a diagram schematically illustrating the light-emitting device according to the fourth embodiment, and is a front view of the light-emitting device. FIG. 19 is a diagram schematically illustrating the light-emitting device according to the fourth embodiment, and is a sectional view taken along line XIX-XIX in FIG. 18. A light-emitting device 1B includes a package 20B, a light emitting element 30B, the third resin body 40, and the wire 50. The shapes of the package 20B and the light emitting element 30B in the light-emitting device 1B are different from those of the light-emitting device 1 according to the first embodiment. In the following, any component same as that of the light-emitting device 1 according to the first embodiment is denoted by the same reference numeral, and description thereof will be omitted. The light emitting element 30B is different from the light emitting element 30 according to the first embodiment in that the light emitting element 30B is formed in a laterally long rectangle in a plan view.

The package 20B has a substantially rectangular parallelepiped shape in which its profile is formed flat in a Z-axis direction as the thickness direction of the light-emitting device 1B, and is suitable for side-view mounting favorably used for, for example, a light source for backlight of a liquid crystal display. The package 20B includes a pair of the leads 23, the first resin body 24, the second resin body 25, and the reflective film 27, and the pair of leads 23 are integrated with the first resin body 24 and the second resin body 25. The first resin body 24 includes the recess 26 that opens toward the front side of the light-emitting device 1B (negative Y-axis direction). Thus, the first resin body 24 serves as the lateral wall 26d of the recess 26.

In the package 20B, the recess 26 includes a laterally long opening in front view. More specifically, the opening has an octagon shape in which a central part on the bottom side of a rectangle in front view expands downward in a trapezoid shape. The bottom surface 26a of the recess 26 has an elongate shape of a laterally long octagon. The pair of the leads 23 is exposed on the bottom surface 26a of the recess 26, and the light emitting element 30B is mounted on one of the leads 23.

A smooth tilt may be provided to an inner surface of the lateral wall 26d of the recess 26, and fine unevenness may be provided on the surface to have a light-scattering shape. Alternatively, a surface substantially vertical to the bottom surface 26a of the recess 26 may be provided in place of a tilted surface. An upper wall part 26e and a lower wall part 26f as parts of the lateral wall 26d of the recess 26 that are provided opposite to each other in the thickness direction (Z-axis direction) of the light-emitting device 1B are formed thinner than other wall part. In other words, the upper wall part 26e and the lower wall part 26f are formed thinner than two lateral wall parts provided opposite to each other in the width direction (X-axis direction) of the light-emitting device 1B. The pair of the leads 23 provided on the bottom surface 26a of the recess 26 protrude from an outer surface of the lower wall part 26f and are then bent to extend along the lower surface of the first resin body 24.

A gate mark is formed on the package 20B on a back surface side of the light-emitting device 1B. The gate is used for injecting a resin material into a mold when the first resin body 24 and the second resin body 25 are formed by the injection molding. The gate mark is formed of the first resin body 24 and covered by the reflective film 27. The second resin body 25 is arranged between the pair of the leads 23. The reflective film 27 is provided on a surface (the upper surface 25a) of the second resin body 25 on a front side of the light-emitting device 1B. The surface of the first resin body 24 of the package 20B including the inner surface 26b of the lateral wall 26d of the recess 26 and a surface around the opening 26c of the recess 26 is covered by the reflective film 27. The recess 26 is filled with the third resin body 40.

Similarly to the first embodiment, the light-emitting device 1B can be manufactured in a collective substrate. The lead frame is molded, cut, and then bent at a predetermined part to form external connection terminal parts of the leads 23 of the package 20B.

The pair of leads 23 is provided in the light-emitting device 1B in a suitable manner for side-view mounting. The package 20B is structured to achieve a smaller thickness of the side-view light-emitting device 1B. Since a side-view package has a smaller thickness of a lateral wall provided in the thickness direction, light is likely to leak in the thickness direction in a side-view light-emitting device. However, in the light-emitting device 1B, the entire resin body is covered by the reflective film 27, and the inner and outer surfaces of the upper wall part 26e and the lower wall part 26f are covered by the reflective film 27. This can reduce light leaking from a thin wall part and achieve an enhanced light flux.

Fifth Embodiment

Configuration of Light-Emitting Device

Figure 20:
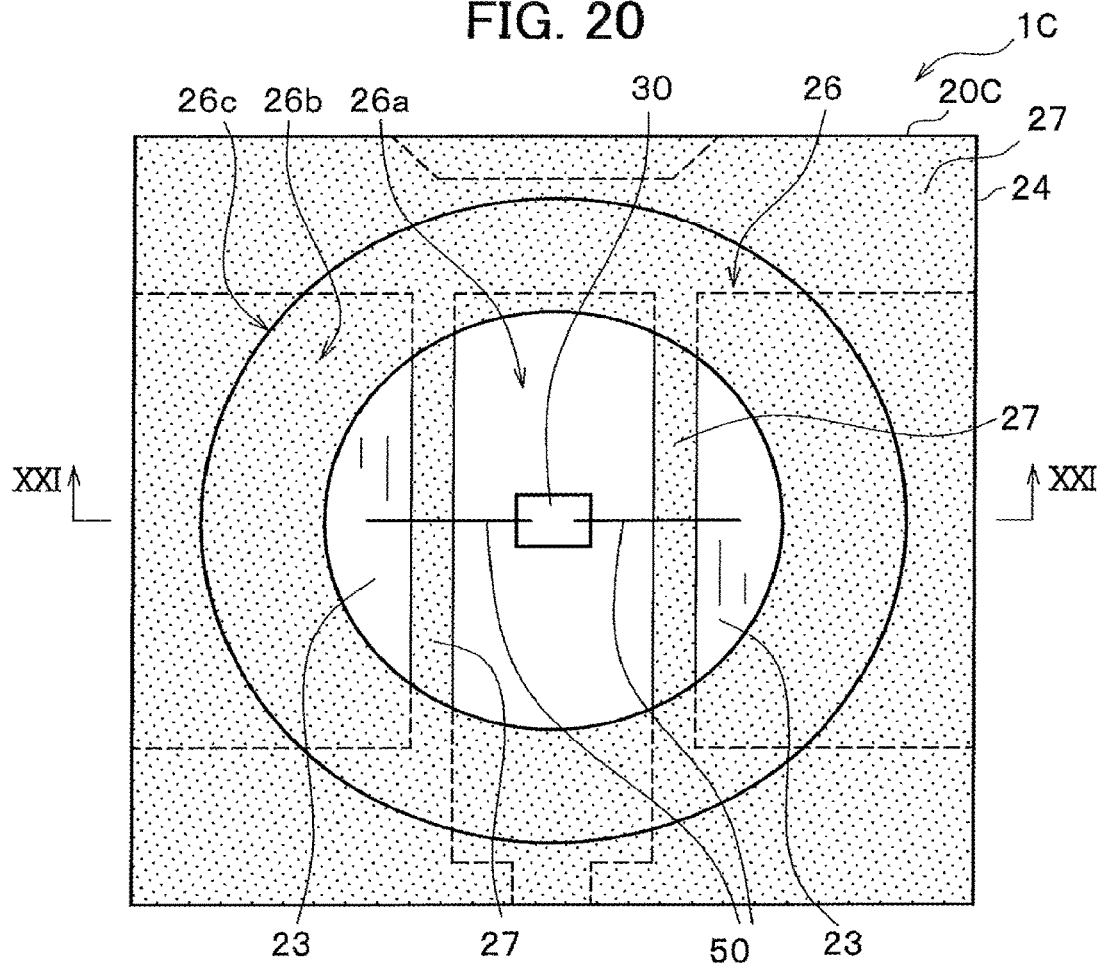
FIG. 20 is a diagram schematically illustrating a light-emitting device according to a fifth embodiment, and is a top view of the light-emitting device.
Figure 21:
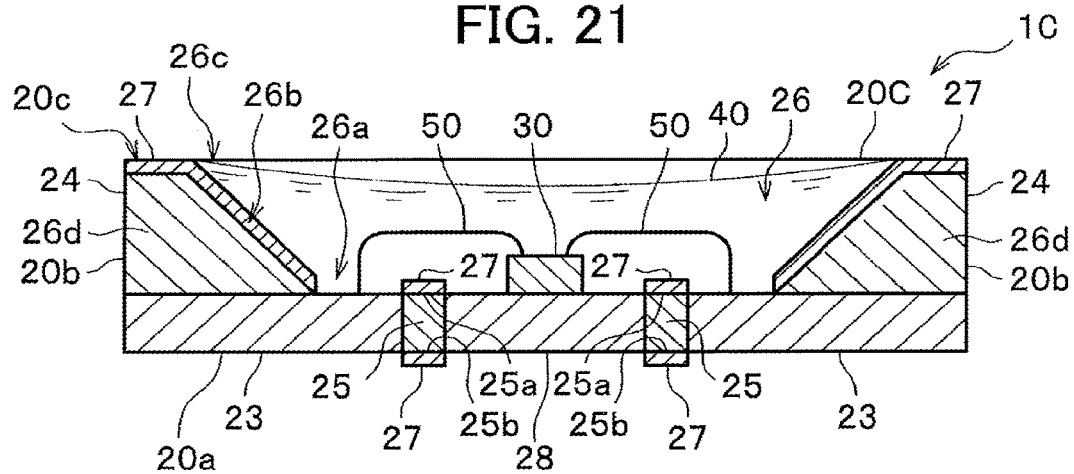
FIG. 21 is a diagram schematically illustrating the light-emitting device according to the fifth embodiment, and is a sectional view taken along line XXI-XXI in FIG. 20.

FIG. 20 is a diagram schematically illustrating a light-emitting device according to a fifth embodiment, and is atop view of the light-emitting device. FIG. 21 is a diagram schematically illustrating the light-emitting device according to the fifth embodiment, and is a sectional view taken along line XXI-XXI in FIG. 20. A light-emitting device 1C includes a package 20C, the light emitting element 30, the third resin body 40, and the wire 50. The shape of the package 20C in the light-emitting device 1C is different from that of the light-emitting device 1 according to the first embodiment. In the following, any component same as that of the light-emitting device 1 according to the first embodiment is denoted by the same reference numeral, and description thereof will be omitted.

The package 20C includes an element mounting part 28 at the bottom surface 26a of the recess 26. The package 20C includes the element mounting part 28 in addition to the pair of the leads 23. The element mounting part 28 is a land (die pad) with which a light emitting element 30 is joined. The light emitting element 30 is disposed in the element mounting part 28 and electrically connected with the pair of the leads 23.

In the present embodiment, the element mounting part 28 is made of the same conductive material as that of the lead 23. However, a voltage is applied from the pair of the leads 23 to the light emitting element 30, and thus is not applied to the element mounting part 28. Such an element mounting part 28 can be formed by, for example, extending the one hanger lead 222 corresponding to one package in the lead frame 22C illustrated in FIG. 16 to achieve deformation into such a shape that the hanger lead 222 is disposed in a gap between the pair of the leads 23.

When made of a resin member such as epoxy resin or silicone resin, the element mounting part 28 may be formed on, for example, one of the leads 23.

Sixth Embodiment

Configuration of Light-Emitting Device

Figure 22:
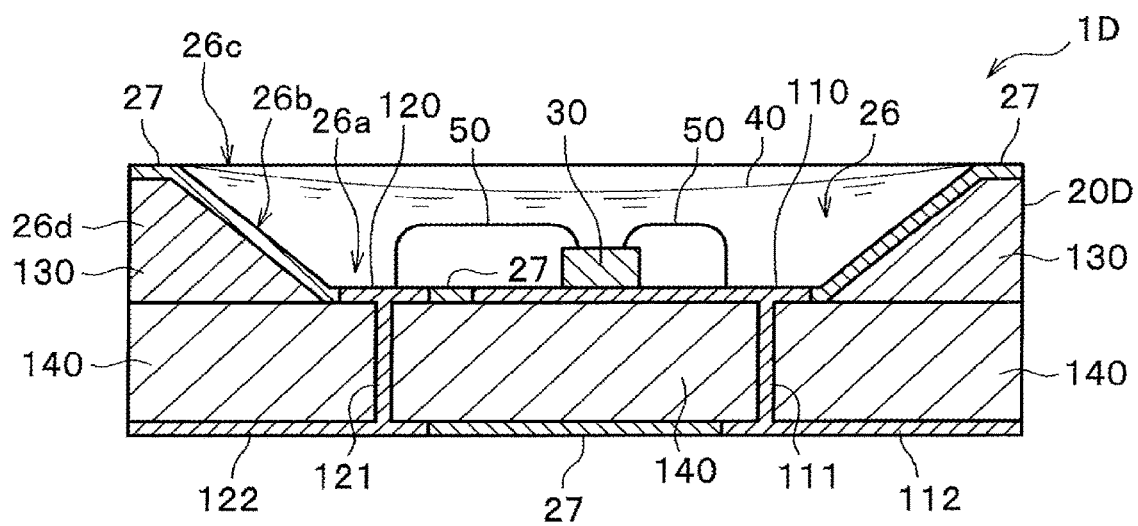
FIG. 22 is a sectional view schematically illustrating a light-emitting device according to a sixth embodiment.

FIG. 22 is a sectional view schematically illustrating a light-emitting device according to a sixth embodiment. A light-emitting device 1D includes a ceramic package 20D, the light emitting element 30, the third resin body 40, and the wire 50. In the light-emitting device 1D, the shape and material of the ceramic package 20D are different from those of the light-emitting device 1 according to the first embodiment. In the following, any component same as that of the light-emitting device 1 according to the first embodiment is denoted by the same reference numeral, and description thereof will be omitted.

The ceramic package 20D has a substantially rectangular parallelepiped shape and includes the recess 26 provided on its upper surface. The ceramic package 20D includes a second ceramic body 140, and a first ceramic body 130 provided on the second ceramic body 140. The first ceramic body 130 and the second ceramic body 140 are each made of one insulating sheet or a stack of insulating sheets.

The materials of the first ceramic body 130 and the second ceramic body 140 are, for example, ceramics. The ceramics preferably contain a main material selected from, for example, alumina ($Al_2O_3$), aluminum nitride (AlN), and mullite. A base material of the ceramics is obtained by adding a sintering agent to this main material and performing sintering thereof. Low-temperature simultaneous firing ceramics may be used.

In order to efficiently reflect light, the base material of the ceramics contains a material (for example, a white filler such as titanium oxide) having a high light reflectance. A conductive wiring in various kinds of patterns can be provided on a green sheet before firing. After the firing of the material of the ceramics, a metal material such as gold, silver, copper, or aluminum is arranged on an underlayer by plating or sputtering.

The second ceramic body 140 has a substantially plate shape, and the first ceramic body 130 is provided with a hole. The second ceramic body 140 and the first ceramic body 130 are laminated to form the recess 26. The first ceramic body 130 forms the lateral wall 26d of the recess 26. In the recess 26, a pair of conductive wirings 110 and 120 are provided from the bottom surface 26a of the recess 26 to the lower surface of the ceramic package 20D, and arranged separately from each other. The second ceramic body 140 is arranged between the conductive wirings 110 and 120. When used in the light-emitting device 1D, the conductive wirings 110 and 120 correspond to an anode electrode and a cathode electrode. The light emitting element 30 is disposed, for example, on the conductive wirings 110. Element electrodes (not illustrated) provided on the upper surface of the light emitting element 30 are connected with the conductive wirings 110 and 120 through the wire 50. The light emitting element 30 is sealed by the third resin body 40.

Outside parts of the lower surface of the ceramic package 20D are mounted on an external substrate. The conductive wirings 112 and 122 are provided on the lower surface of the ceramic package 20D continuously from the conductive wirings 110 and 120 through conductive wirings 111 and 121. Thus, the conductive wirings 112 and 122 are connected with the two element electrodes of the light emitting element 30 through the conductive wirings 110 and 120, respectively. The outermost surfaces of the conductive wirings 110 and 120 arranged in the recess 26 are preferably covered by, for example, a metal material having a high reflectance, such as silver.

The reflective film 27 covers the inner surface 26b of the lateral wall 26d of the recess 26. The reflective film 27 also covers the upper surface of the second ceramic body 140, specifically, a part on the bottom surface 26a of the recess 26 arranged between the conductive wirings 110 and 120. The reflective film 27 also covers the lower surface of the second ceramic body 140, specifically, a part on the lower surface of the ceramic package 20D arranged between the conductive wirings 112 and 122. The reflective film 27 also covers the upper surface of the first ceramic body 130, specifically, the surface around the opening 26c of the recess 26. Similarly to the first embodiment, the light-emitting device 1D can be manufactured in a collective substrate.

EXAMPLE

The following experiment was performed to check the performance of the light-emitting device according to the present invention. A light-emitting device (hereinafter referred to as Example 1) having the same shape as that of the light-emitting device 1 was manufactured. A method of manufacturing the light-emitting device as Example 1 is as follows.

The resin compact 21 was prepared in a collective substrate. The lead frame 22 of the resin compact 21 was formed of a copper alloy and provided with silver plating on its surface. The material of the first resin body 24 was epoxy resin containing 10% by weight of titanium oxide as a light reflecting member. The material of the second resin body 25 was also epoxy resin containing 10% by weight of titanium oxide. The titanium oxide used in the first resin body 24 and the second resin body 25 had an average particle size of 0.2 µm. Slurry of a dispersion liquid (15% by weight) including toluene as an organic solvent and titanium oxide of a particle diameter of 30 nm as a light reflecting member was prepared for a reflective film.

In the process of forming a reflective film, the resin compact 21 was immersed in this slurry and then dried, so that the resin compact 21b on which the reflective film 27 is formed is generated. In the process of removing part of the reflective film, an electro-chemical deburring device was prepared, and a voltage was applied to the resin compact 21b at a current density of 1500 A/m$^2$ using water as an electrolyte solution. Then, any resin burr or reflective film floating on the resin compact 21c taken out from the electrolytic bath 80 was removed through the waterjet process. A GaN-based blue-light emitting element having a peak wavelength of 450 nm was used as the light emitting element 30. A silicone resin containing a YAG fluorescent member was used as the third resin body 40. The reflective film 27 was not remaining on the lead frame 22 as a metal part, but was arranged only on part of the first resin body 24 and the second resin body 25.

The light-emitting device thus manufactured in Example 1 had a plane size of 3 mm×3 mm and a width W of 600 µm between the pair of the leads 23. Hereinafter, Comparative Example 1 refers to a light-emitting device manufactured similarly without the process of forming a reflective film.

Color Tone Comparison Result

As a result of an experiment using a chromaticity measuring device, the light-emitting devices in Comparative Example 1 and Example 1 had such a color tone that x and y values of an xy chromaticity value are both 0.34. This concludes that the color tone has a negligible difference depending on the presence of the reflective film 27.

Light Flux Comparison Result

As a result of an experiment using a light flux measuring device, a light flux measured for Example 1 was 101% where 100% corresponds to a light flux measured for Comparative Example 1. This confirms an effect that the reflective film 27 provides an increase of 1% in the light flux.

TABLE 1

| | Color Tone | | |
|---|---|---|---|
| | x | y | Light Flux |
| Comparative Example 1 | 0.34 | 0.34 | 100% |
| Example 1 | 0.34 | 0.34 | 101% |

Although detailed descriptions are made on the package and the light-emitting device according to the embodiments of the present disclosure, and the method of manufacturing the same, the scope of the present invention is not limited to these descriptions, and should be widely interpreted based on recitations in the claims. It is clear that various kinds of changes and modifications of the preset invention based on these recitations are included in the scope of the present invention.

The light-emitting device according to the present embodiment is applicable to a backlight light source of a liquid crystal display, and various kinds of light sources of various illumination apparatuses, a large-scale display, various display devices for advertisements, guiding information, and the like, image capturing devices in a digital video camera, a facsimile, a photocopier, a scanner, and the like, and a projector device.

What is claimed is:

1. A package having a recess comprising:
   a pair of leads forming a surface of a bottom portion on the recess;
   a first resin body forming a lateral wall on the recess;
   a second resin body arranged between the pair of leads; and
   a reflective film covering an inner surface of the lateral wall on the recess and an upper surface and a lower surface of the second resin body.

2. The package according to claim 1, wherein:
   the reflective film further covers an upper surface of a peripheral part of an opening of the recess.

3. The package according to claim 1, wherein:
   the first resin body and the second resin body are entirely covered by the reflective film.

4. The package according to claim 1, wherein:
   the reflective film extends to a boundary between each of the pair of leads and the inner surface of the lateral wall on the recess,
   the reflective film extends to a boundary between each of the pair of leads and the upper surface of the second resin body, and
   the reflective film extends to a boundary between each of the pair of leads and the lower surface of the second resin body.

5. The package according to claim 1, wherein:
   the reflective film has an average thickness of 10 to 1000 nm.

6. The package according to claim 1, wherein:
   the reflective film mainly includes a metallic oxide having a particle diameter of 1 to 100 nm.

7. The package according to claim 6, wherein:
   the metallic oxide is titanium oxide.

8. The package according to claim 1, wherein:
   the first resin body and the second resin body include at least one selected from the group consisting of epoxy resin, modified epoxy resin, silicone resin, modified silicone resin, acrylate resin, and urethane resin.

9. The package according to claim 1, further comprising an element mounting part on which a light emitting element is mounted.

10. A light-emitting device comprising:
    a package having a recess; and
    a light emitting element, wherein
    the package includes:
      a pair of leads forming a surface of a bottom portion on the recess;
      a first resin body forming a lateral wall on the recess;
      a second resin body arranged between the pair of leads; and
      a reflective film covering an inner surface of the lateral wall on the recess and an upper surface and a lower surface of the second resin body, wherein the light emitting element is arranged on at least one of the pair of leads forming the surface of the bottom portion on the recess of the package.

11. The light-emitting device according to claim 10, further comprising an element mounting part on which a light emitting element is mounted, wherein
the light emitting element disposed on the element mounting part located at the surface of the bottom portion on the recess of the package, and being electrically connected with the pair of the leads.

12. The light-emitting device according to claim 10, further comprising a third resin body covering the light emitting element mounted in the recess of the package.

13. The package according to claim 1, wherein:
both ends of the second resin body connect to the lateral wall on the recess.

14. The package according to claim 1, wherein:
the reflective film formed on the inner surface of the lateral wall is provided continuously from the reflective film formed on the surface of the bottom portion on the recess.

15. The package according to claim 1, wherein:
the reflective film formed on the inner surface of the lateral wall is formed of the same material as the reflective film formed on the surface of the bottom portion on the recess.

16. The package according to claim 1, wherein:
the thickness of the reflective film formed on the inner surface of the lateral wall is equal to the thickness of the reflective film formed on the surface of the bottom portion on the recess.

17. The package according to claim 1, wherein:
the first resin body and the second resin body are integrally formed from a same resin.

18. A package having a recess comprising:
a pair of leads forming a surface of a bottom portion on the recess;
a first resin body forming a lateral wall on the recess;
a second resin body arranged between the pair of leads; and
a reflective film covering at least an inner surface of the lateral wall on the recess, and an upper surface and a lower surface of the second resin body,
wherein the reflective film extends to a boundary between each of the pair of leads and the inner surface of the lateral wall on the recess,
the reflective film extends to a boundary between each of the pair of leads and the upper surface of the second resin body, and
the reflective film extends to a boundary between each of the pair of leads and the lower surface of the second resin body.

19. A light-emitting device comprising:
a package having a recess; and
a light emitting element, wherein
the package includes:
a pair of leads forming a surface of a bottom portion on the recess;
a first resin body forming a lateral wall on the recess;
a second resin body arranged between the pair of leads;
a reflective film covering at least an inner surface of the lateral wall on the recess, and an upper surface and a lower surface of the second resin body; and
a third resin body covering the light emitting element mounted in the recess of the package, wherein
the light emitting element is arranged on at least one of the pair of leads forming the surface of the bottom portion on the recess of the package.

* * * * *